United States Patent
Lee et al.

(10) Patent No.: US 7,372,515 B2
(45) Date of Patent: May 13, 2008

(54) LIQUID CRYSTAL DISPLAY DEVICE

(75) Inventors: Jeoung-Gwen Lee, Suwon-si (KR); Seung-Je Lee, Seongnam-si (KR); Hyun-Su Park, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/994,733

(22) Filed: Nov. 22, 2004

(65) Prior Publication Data

US 2005/0073621 A1 Apr. 7, 2005

Related U.S. Application Data

(62) Division of application No. 10/074,508, filed on Feb. 12, 2002, now Pat. No. 6,847,416.

(30) Foreign Application Priority Data

Aug. 29, 2001 (KR) ............... 2001-52358

(51) Int. Cl.
G02F 1/1335 (2006.01)
(52) U.S. Cl. .................. 349/58; 349/65; 349/113
(58) Field of Classification Search ............ 349/113, 349/58, 68, 65
See application file for complete search history.

(56) References Cited

U.S. PATENT DOCUMENTS

| | | | | |
|---|---|---|---|---|
| 6,064,455 A * | 5/2000 | Kim | ........ | 349/113 |
| 6,295,105 B1 * | 9/2001 | Lee et al. | ........ | 349/65 |
| 6,445,430 B1 * | 9/2002 | Sakamoto et al. | ........ | 349/62 |
| 6,490,016 B1 * | 12/2002 | Koura | ........ | 349/58 |
| 6,580,476 B2 * | 6/2003 | Hasegawa | ........ | 349/58 |
| 6,667,780 B2 * | 12/2003 | Cho | ........ | 349/58 |
| 6,741,299 B2 * | 5/2004 | Fukayama et al. | ........ | 349/58 |
| 6,762,807 B2 * | 7/2004 | Lee et al. | ........ | 349/58 |
| 6,854,856 B2 * | 2/2005 | Shin et al. | ........ | 362/613 |
| 6,867,827 B2 * | 3/2005 | Cha et al. | ........ | 349/65 |

FOREIGN PATENT DOCUMENTS

| | | |
|---|---|---|
| CN | 1220407 | 6/1999 |
| JP | 6-242321 * | 9/1994 |
| JP | 07230004 | 8/1995 |
| JP | 2000047208 | 2/2000 |

* cited by examiner

OTHER PUBLICATIONS

Korean Office Action; 045692324; Aug. 24, 2007. All references cited in the Office action and not previously submitted are listed above.

*Primary Examiner*—Toan Ton
(74) *Attorney, Agent, or Firm*—Cantor Colburn LLP

(57) ABSTRACT

Disclosed is a liquid crystal display device of which overall size and weight can be minimized. The liquid crystal display device has a light generating unit for generating a light. A light guiding plate guides the light to a display unit for displaying an image. A reflection plate is disposed under the light guiding plate for reflecting the light to the light guiding plate. A receiving container receives the reflection plate, the light guiding plate and the light generating unit. At least one boss is formed on a bottom of the receiving container for preventing the light generating unit from being moved by guiding a position of the light generating unit. Accordingly, the number of the parts installed in the liquid crystal display device can be reduced, and the manufacturing cost can be decreased because the manufacturing process is simplified in comparison with the liquid crystal display device including a separate lamp cover.

13 Claims, 31 Drawing Sheets

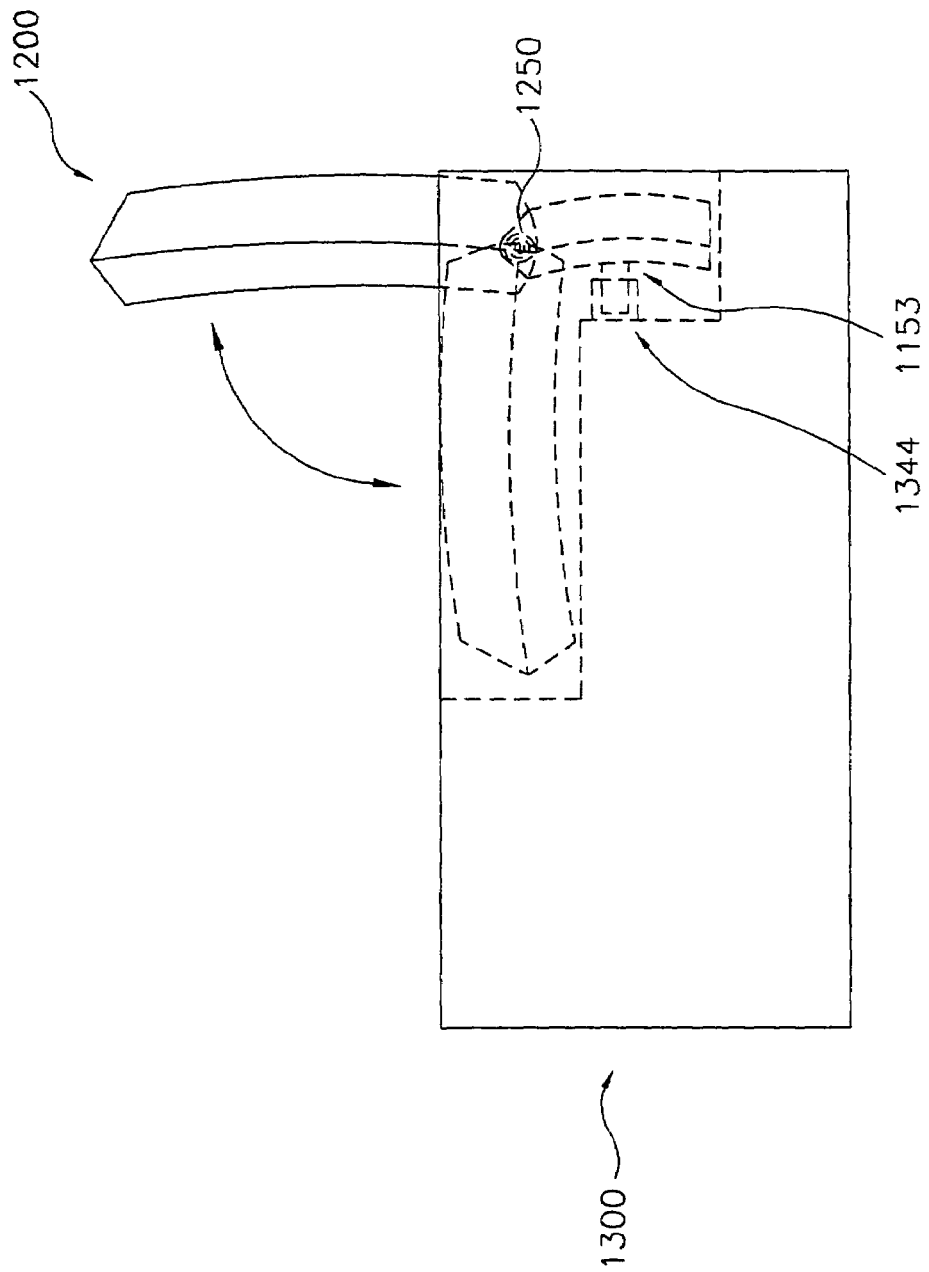

LIQUID CRYSTAL DISPLAY DEVICE

CROSS REFERENCE TO RELATED APPLICATIONS

This application is a divisional application of U.S. patent application Ser. No. 10/074,508, filed on Feb. 12, 2002, now U.S. Pat. No. 6,847,416 the disclosure of which is herein incorporated by reference in its entirety.

BACKGROUND OF THE INVENTION

1. Field of the Invention

The present invention relates to a liquid crystal display device, and more particularly to a liquid crystal display device having a small size for portable mobile communication devices or game devices.

2. Description of the Related Art

Information processing devices have been rapidly developed in a trend with various architectures, functions and faster information processing speed. Information processed in these information processing devices has an electrical signal format. In order to visually confirm information processed in the information processing device, a display device as an interface is necessary.

A liquid crystal display device, which is lighter and smaller than a CRT type display device, has been developed. The liquid crystal display device enables a full color display with a high resolution. As a result, the liquid crystal display device is widely used for a monitor of a computer, a television receiver, and another display device.

When a voltage is applied to a liquid crystal cell, a molecular arrangement of the liquid crystal is changed to cause a change in optical properties. As a result, visual properties are changed to display various images.

Liquid crystal display devices are divided into to a TN (Twisted Nematic) type and an STN (Super-Twisted Nematic) type. The liquid crystal devices are also divided according to the driving type into an active matrix display type that uses a switching device, and a TN liquid crystal and a passive matrix display type using an STN liquid crystal.

The active matrix display type is used in a TFT-LCD and drives an LCD by using a TFT as a switching device. The passive matrix display type does not use any transistor and does not need a complex circuit.

Further, liquid crystal display devices are divided into a transmissive liquid crystal display device using a backlight and a reflective liquid crystal display device that uses an exterior light source according to a method for using a light source.

The transmissive liquid crystal display device which uses the back light as a light source has a heavy weight and a large volume by the existence of the back light, but is widely used since it independently displays an image without using an exterior light source.

In particular, a liquid crystal display device having a properly reduced size for portability is demanded according to the rapid development of the communication devices. Thus, a display device is desired which has light weight, thin thickness and small size as well as high display quality to be applied to the mobile communication devices and to the game devices considering portability thereof.

SUMMARY OF THE INVENTION

The present invention solves the aforementioned problems by providing a liquid crystal display device of which a total weight can be minimized.

Also, the invention provides a liquid crystal display device of which an overall size can be reduced.

Further, the invention provides a liquid crystal display device which is easily assembled with an external apparatus such as an information processing device.

The invention further provides a liquid crystal display device capable of minimizing loss of a light.

In one aspect of the invention, there is provided a liquid crystal display device having a light generating unit for generating a light, a light guiding plate for guiding the light toward a display unit for displaying an image, a reflecting plate disposed under the light guiding plate for reflecting the light to the light guiding plate, and a receiving container for receiving the reflecting plate, the light guiding plate and the light generating unit. At least one boss is formed on a bottom of the receiving container for preventing the light generating unit from being moved by guiding a position of the light generating unit.

The receiving container includes a first receiving container having a side wall and a bottom where an opening is formed at a predetermined portion of the bottom for exposing a rear surface of the reflecting plate, and a second receiving container for preventing the reflecting plate, the light guiding plate and the light generating unit from being separated from the first receiving container. The second receiving container is combined with the first receiving container. Four bosses may be respectively formed at corner portions of the bottom of the first receiving container and the four bosses are spaced from the side wall of the first receiving container by a predetermined interval.

Also, a reflecting portion is extended from an end of the reflecting plate by a predetermined length. The reflecting portion may be bent to enclose an outer face of the light generating unit and may be further extended to cover an upper portion of the light generating unit.

At least one first penetrating hole corresponding to the boss formed on the bottom of the first receiving container is formed at the reflecting plate, and the reflecting plate is guided to a receiving position by means of a combination between the at least one boss and the at least one first penetrating hole.

The light generating unit includes a lamp having an integral body, for example, of a laid U shape and the lamp is received between the at least one boss and the side wall of the first receiving container. The reflecting portion may have a first reflection portion, a second reflection portion and a third reflection portion formed from ends of the reflecting plate corresponding to the lamp of the laid U shape having first and second bending portions. An upper face of the first bending portion of the lamp is covered with an overlap of first end portions of the first and second reflection portions adjacent to the first bending portion, and an upper face of a second bending portion of the lamp is covered with an overlap of second end portions of the second and third reflection portions adjacent to the second bending portion. At that time, the first end portion of the first reflection portion covering the first bending portion is extended longer than the first end portion of the second reflection portion, and the second end portion of the third reflection portion covering the second bending portion is extended longer than the second end portion of the second reflection portion.

At least one opening corresponding to a shape of the lamp is formed in the bottom of the first receiving container to radiate a heat generated from the lamp.

Also, the liquid crystal display device further includes diffusion sheets for enlarging a visual angle of the light emitted from the light guiding plate to provide the light to the display unit, and the diffusion sheets are guided by a plurality of protuberances formed at an upper portion of a wall of the first receiving container.

Furthermore, the liquid crystal display device includes a top chassis combined with the first receiving container for fixing the display unit received on the second receiving container to the second receiving container, and a printed circuit board combined with the rear surface of the first receiving container for controlling operations of the light generating unit and the display unit. A combining portion is formed by being partially extended from a side wall of the top chassis, and the combining portion is combined with a ground terminal of the printed circuit board.

The light generating unit includes a power supply line formed at both ends thereof to receive a driving power from outside. An isolation wall is formed on the bottom of the first receiving container spaced from one side wall of the first receiving container, and the power supply line is guided from the first and the second receiving containers to outside through a space between the isolation wall and the side wall.

In another aspect, there is provided a liquid crystal display device having a display unit for displaying an image, a receiving container for receiving the display unit, a power supplying unit for providing a driving power to the display unit, and a printed circuit board having an opening for receiving the power supplying unit. The power supplying unit is inserted and received in the opening of the printed circuit board.

The power supplying unit may be a transformer for converting a power from outside into the driving power which is to be provided to the display unit.

In further aspect, there is provided a liquid crystal display device including a display unit for displaying an image, a receiving container for receiving the display unit, a first printed circuit board installed beneath a bottom of the receiving container wherein the first printed circuit board has a power supplying unit for providing a driving power to the display unit and a signal converting unit for converting a signal provided to the display unit, a first connector installed on a second printed circuit board separated from the first printed circuit board wherein the first connector is connected to the power supplying unit through a power supplying line for providing a power inputted from outside to the power supplying unit, a second connector installed on a third printed circuit board separated from the first and second printed circuit boards wherein the second connector is connected to the signal converting unit through a data transmitting line for providing a data signal inputted from outside to the signal converting unit, a front case combined with the display unit, and a rear case combined with the front case to receive the display unit. First and second openings, for receiving the second and third printed circuit boards, are respectively formed in the front and rear cases to expose the first and second connectors, and the first and second connectors respectively received in the first and second openings are movable to be apart from each other.

A third opening is formed in the first printed circuit board to receive the power supplying unit and the power supplying unit is inserted in the third opening by a predetermined depth. The power supplying unit may be a transformer for converting a power from outside into the driving power which is to be provided to the display unit.

In still another aspect, there is provided a liquid crystal display device including a light generating unit for generating a light, a light guiding plate for guiding the light to a display unit for displaying an image, a reflection plate installed under the light guiding plate for reflecting the light to the light guiding plate, and a receiving container for receiving the reflection plate, the light guiding plate and the light generating unit. An end of the reflection plate is extended by a predetermined length to form a reflecting portion, and the reflecting portion may be bent to enclose an outside of the light generating unit and may be further extended to cover an upper face of the light generating unit.

According to the liquid crystal display device of the invention, the number of the parts installed in the liquid crystal display device can be reduced and the manufacturing cost can be decreased because the manufacturing process is simplified in comparison with the liquid crystal display device adopting a separate lamp cover.

Also, the transformer supplying the driving power to the lamp and the liquid crystal display panel is received in the opening formed in the printed circuit board installed on the rear surface of the receiving container by being inserted into a predetermined depth. Thus, the whole thickness of the liquid crystal device can be reduced as much as the depth that the transformer is inserted into the opening.

BRIEF DESCRIPTION OF THE DRAWINGS

The above and other objects and advantages of the present invention will become readily apparent by reference to the following detailed description with reference to the accompanying drawings in which:

FIG. 31 is a schematic perspective view for illustrating an operation state of the liquid crystal display device assembled with the outer information processing device shown in FIG. 30.

DETAILED DESCRIPTION OF THE INVENTION

Hereinafter, a liquid crystal display device according to the exemplary embodiment of the present invention will be described in detail with reference to the accompanying drawings.

Figure 1:
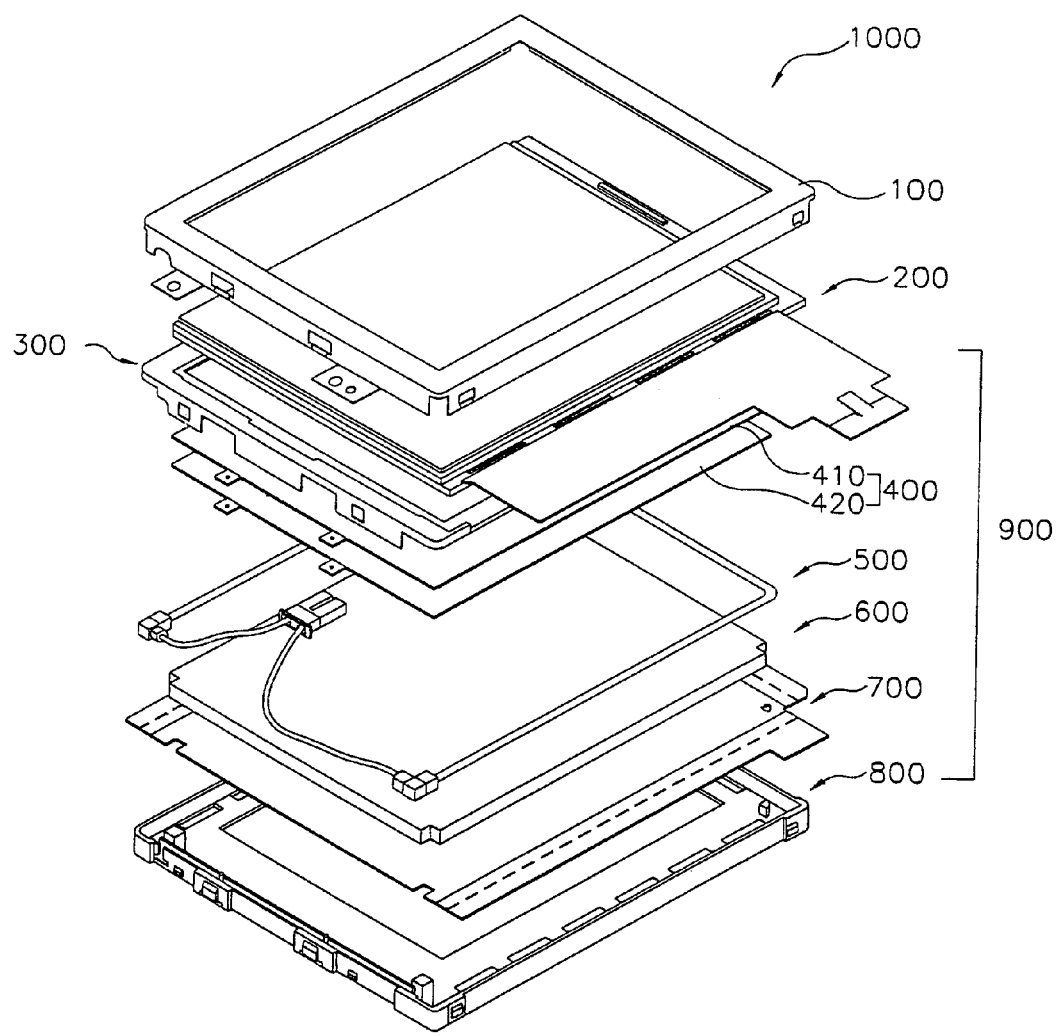
FIG. 1 is an exploded perspective view for schematically showing a liquid crystal display device according to an exemplary embodiment of the present invention.

FIG. 1 is an exploded perspective view for schematically showing a liquid crystal display device according to an exemplary embodiment of the present invention.

Referring to FIG. 1, the liquid crystal display device 1000 includes a liquid crystal display module for displaying an image when an image signal is applied thereto and a case (not shown) having front and rear cases for receiving the liquid crystal display module.

The liquid crystal display module includes a display unit 200 having a liquid crystal display panel for displaying the image and a back light assembly 900 for providing a light to the display unit 200. The display unit 200 is mounted on the back light assembly 900 and fixed thereon by means of a top chassis 100 combined with the back light assembly 900.

The back light assembly 900 has a lamp 500 generating the light, a light guide plate 600 for guiding the light generated from the lamp 500 to the display unit 200, a reflection plate 700 for reflecting the light from the light guide plate 600, a plurality of diffusion sheets 400 disposed on the light guide plate 600 for adjusting a visual angle of the light, a lower mold frame 800 for receiving the reflection plate 700, the light guide plate 600, the lamp 500 and the diffusion sheets 400, and an upper mold frame 300 which is combined with the lower mold frame 800 and fixes the reflection plate 700, the light guide plate 600, the lamp 500 and the diffusion sheets 400. In FIG. 1, first and second diffusion sheets 410 and 420 are shown, but of course it is understood that the number of the diffusion sheet is not limited to two (2).

Hereinafter, the display unit 200 and the back light assembly 900 of the liquid crystal display device 1000 will be described in detail with reference to the FIGS. 2 to 12.

Figure 2:
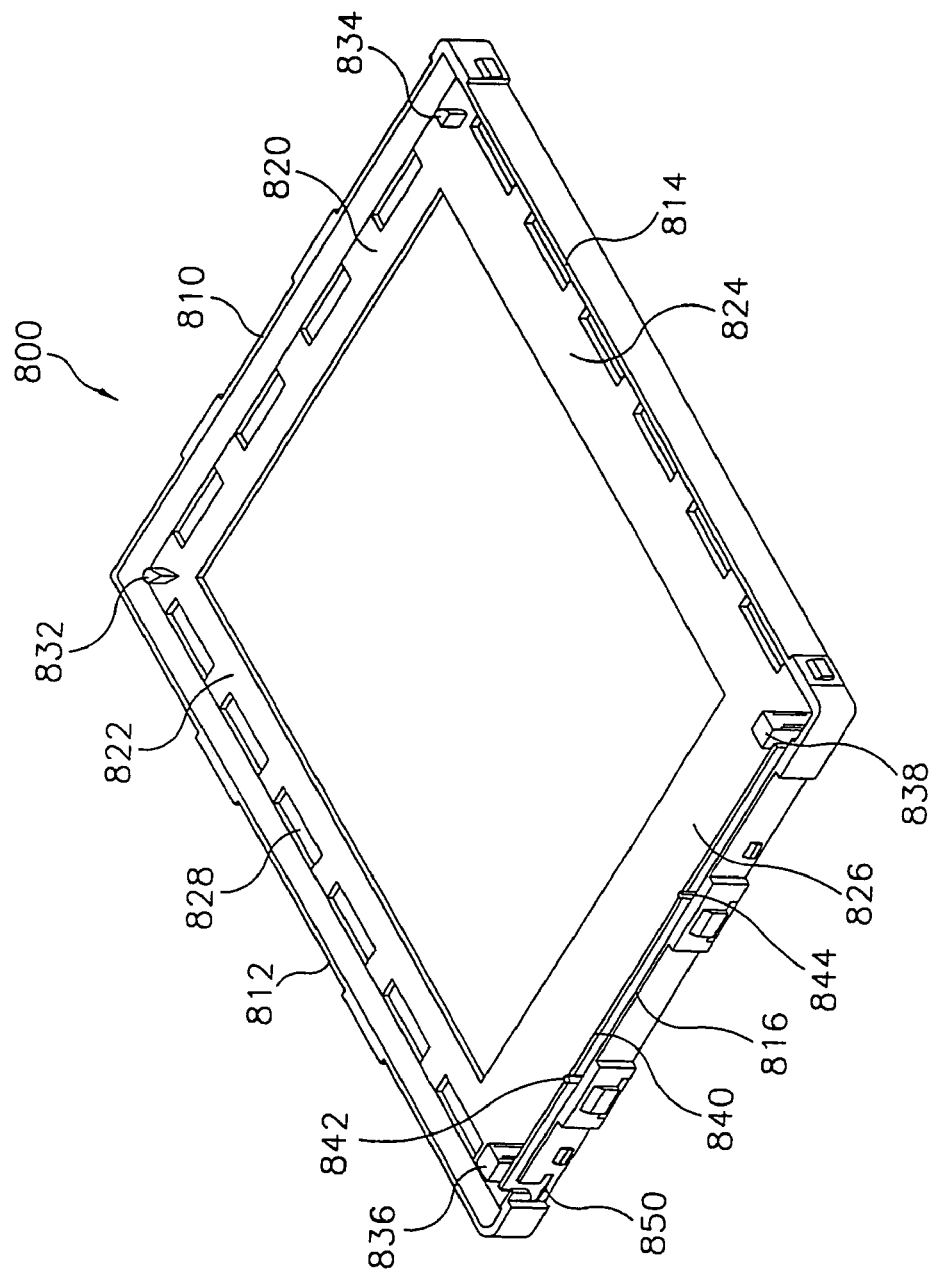
FIGS. 2 and 3 are a perspective view and a plan view for illustrating a lower mold frame shown in FIG. 1.
Figure 3:
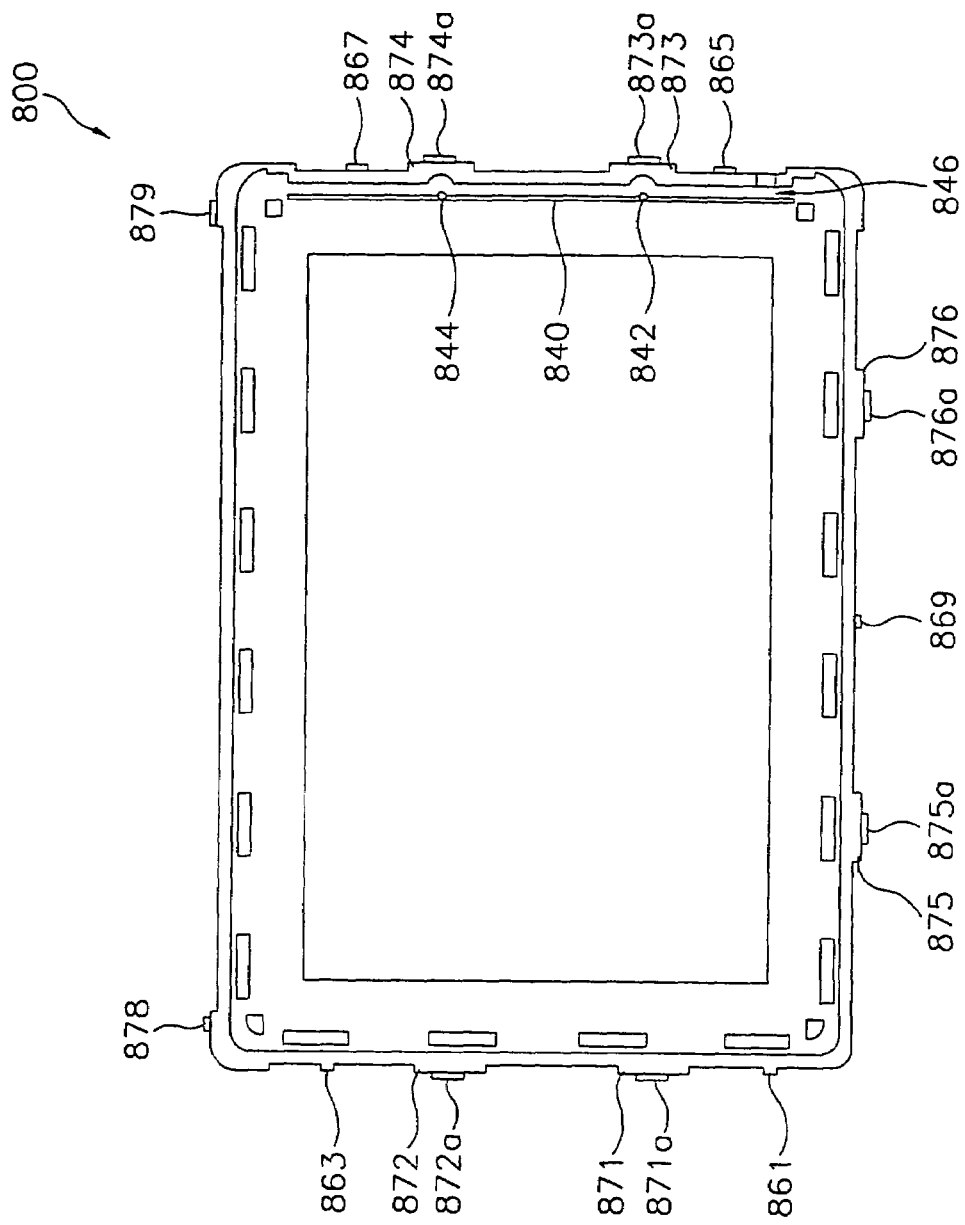

FIGS. 1-3 are respectively a prospective view and a plan view for particularly illustrating the lower mold frame 800 shown in FIG. 1.

Referring to FIGS. 2 and 3, the lower mold frame 800 has first, second, third and fourth walls 810, 812, 814 and 816 integrally connected one after another and first, second, third and fourth bottoms 820, 822, 824 and 826 respectively extended from the first to fourth walls 810, 812, 814 and 816. An opening having a predetermined shape is formed at a central portion of the lower mold frame 800 and the opening is defined by the first to fourth bottoms 820, 822, 824 and 826 and exposes a rear surface of the reflection plate 700.

First, second, third and fourth protuberances 832, 834, 836 and 838 are respectively formed on the corners of the bottoms 820, 822, 824 and 826 of the lower mold frame 800. The first to fourth protuberances 832, 834, 836 and 838 are respectively spaced apart from the first to fourth walls 810, 812, 814 and 816 by a predetermined interval. The first, second, third and fourth protuberances 832, 834, 836 and 838 fix the lamp 500 and the light guide plate 600 in predetermined positions and prevent the lamp 500 from being damaged due to the movement of the light guide plate 600. Such functions of the protuberances 832, 834, 836 and 838 will be described later.

Meanwhile, a plurality of openings 828 having predetermined sizes are formed on the first, second and third bottoms 820, 822 and 824. The lamp 500 is disposed on the first, second and third bottoms 820, 822 and 824 of the lower mold frame 800 while the reflection plate 700 is interposed between the lamp 500 and the lower mold frame 800, and the heat generated from the lamp 500 can be easily radiated to an outside of the device through the openings 828. The openings 828 are only formed on the first, second and third bottoms 820, 822 and 824 since the lamp 500 of the liquid crystal display device 100 has the laid U shape. Thus, when the lamp 500 has a reversed L shape or a linear shape, the openings 828 are formed only on the bottom on which the lamp 500 having the reversed L shape or the linear shape is disposed.

An isolation wall 840 that is spaced apart from the fourth wall 816 by a predetermined interval is formed on the fourth bottom 826 where the openings are not formed so that a groove-shaped guide passage 846 is provided between the fourth wall 816 and the isolation wall 840. A power supplying line of the lamp 500 is guided by the guide passage 846 and extended toward the outside through a leader groove 850 formed by partially opening a portion of the fourth wall 816.

As shown in FIG. 2, the leader groove 850 is formed at a predetermined portion of the fourth wall 816 such that the leader groove 850 is adjacent to a the predetermined portion where a high voltage of the lamp 500 is applied. Also, fifth and sixth protuberances 842 and 844 are formed on an upper end of the isolation wall 840 by a predetermined interval. The fifth and sixth protuberances 842 and 844 are inserted in engaging holes of the diffusion sheets 400 which are mounted on the light guide plate 600, and guide the diffusion sheets 400 so that the diffusion sheets are placed at predetermined positions.

A plurality of protuberances are respectively formed on outer surfaces of the first to fourth walls 810, 812, 814 and 816 of the lower mold frame 800. First and second engaging protuberances 861 and 863 are formed on the first wall 810, and third and fourth engaging protuberances 865 and 867 are formed on the fourth wall 816 facing the first wall 810. Also, a fifth engaging protuberance 869 is formed on the second wall 812. The first to fifth engaging protuberances 861, 863, 865, 867 and 869 are respectively engaged with engaging holes of the upper mold frame 300 so that the first to fifth engaging protuberances 861, 863, 865, 867 and 869 prevent the reflection plate 700, the light guiding plate 600, the lamp 500 and the diffusion sheets 400 from being moved.

In addition, first and second fixing protuberances 871a and 872a are formed on the first wall 810 and third and fourth fixing protuberances 873a and 874a are formed on the fourth wall 816. Fifth and sixth fixing protuberances 875a and 876a are formed on the second wall 812 and seventh and eighth fixing protuberances 878 and 879 are formed on the third wall 814 that faces the second wall 812. The first to eighth fixing protuberances 871a, 872a, 873a, 874a, 875a, 876a, 878 and 879 are respectively combined with fixing holes formed on the top chassis 100 to fix the display unit 200 mounted on the upper mold frame 300 to a predetermined position.

The first to sixth fixing protuberances 871a, 872a, 873a, 874a, 875a and 876a are respectively formed on first, second, third, fourth, fifth and sixth embossings 871, 872, 873, 874, 875 and 876 which are respectively protruded from the first, second and fourth walls 810, 812 and 816. Therefore, the first to sixth fixing protuberances 871a, 872a, 873a, 874a, 875a and 876a are extended further than the first to fifth engaging protuberances 861, 863, 865, 867 and 869. As a result, the first to sixth fixing protuberances 871a, 872a, 873a, 874a, 875a and 876a can be easily combined with the fixing holes formed on the top chassis 100.

Figure 4:
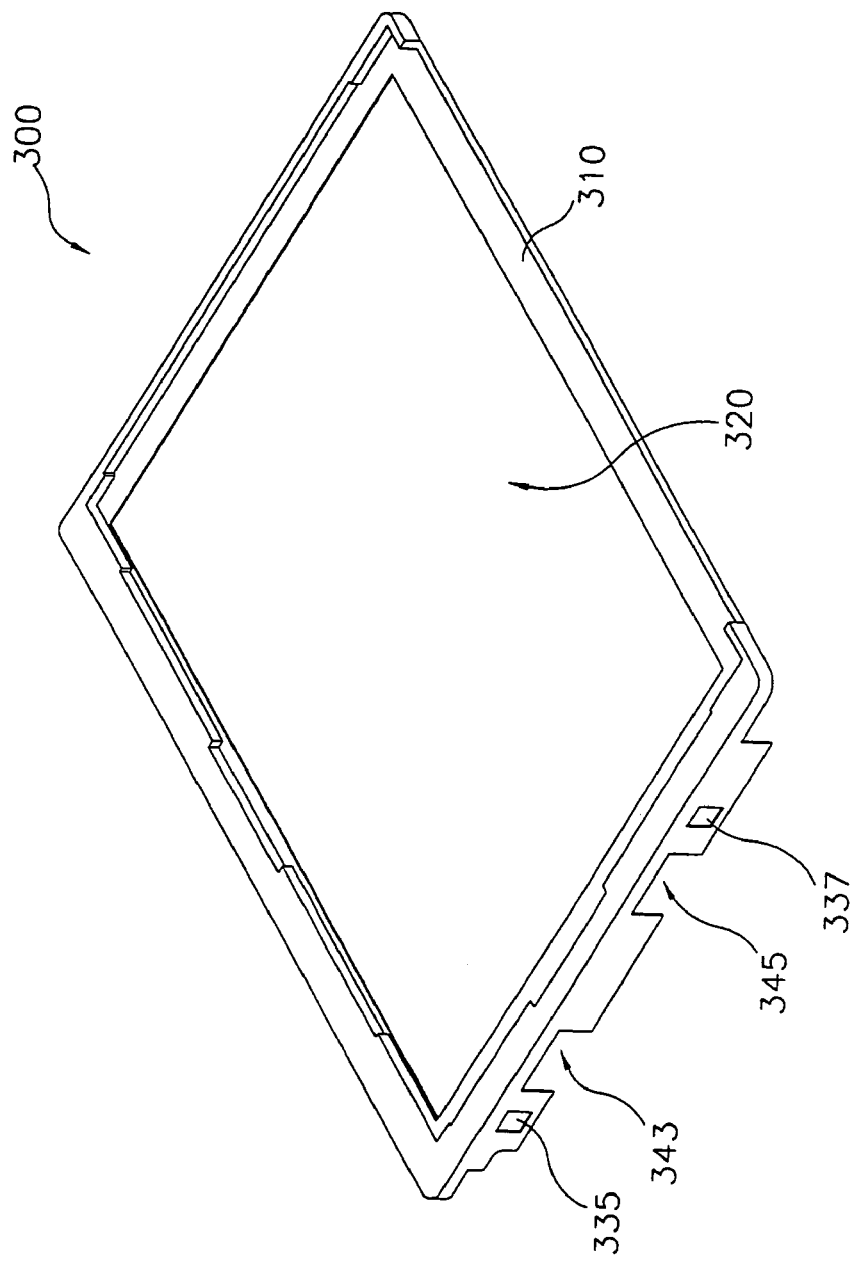
FIGS. 4 and 5 are a perspective view and a plan view for illustrating an upper mold frame shown in FIG. 1.
Figure 5:
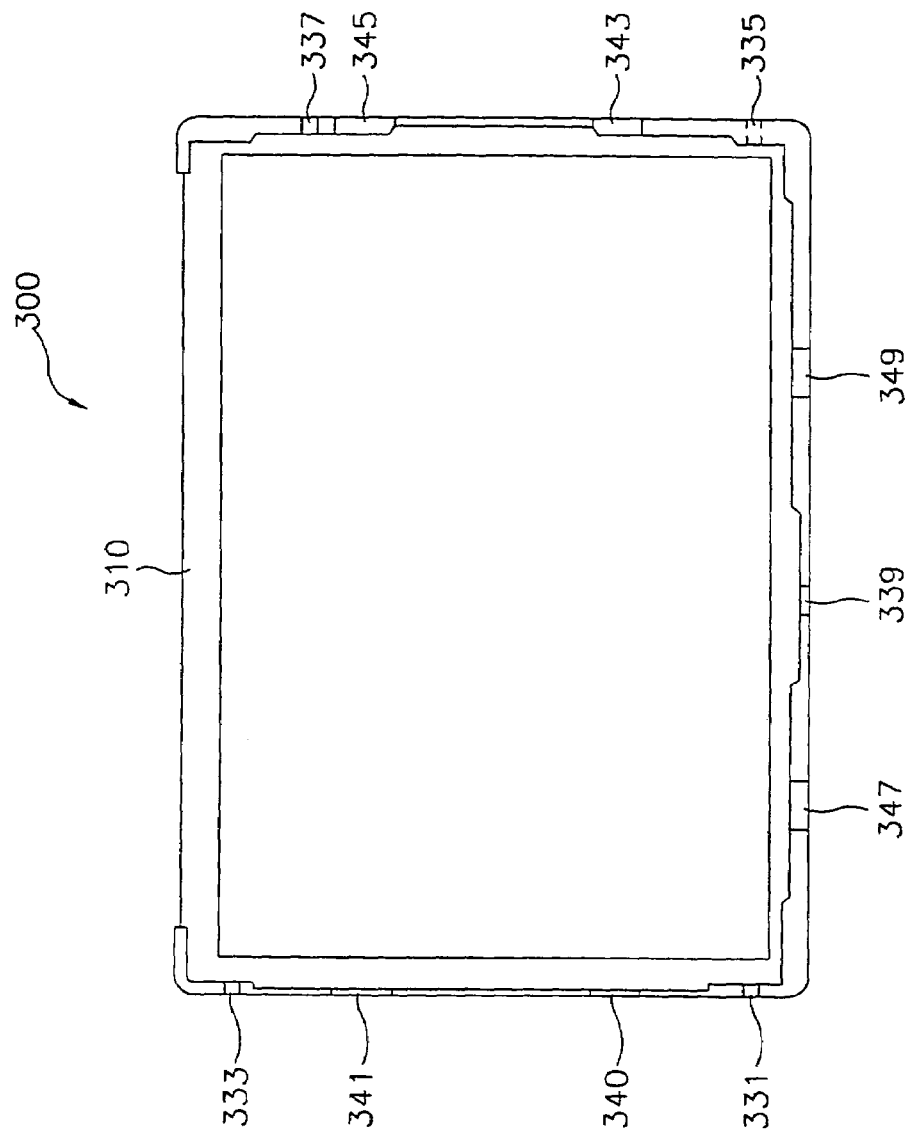

FIGS. 4 and 5 are respectively perspective and plan views for illustrating the upper mold frame 300 shown in FIG. 1.

Referring to FIG. 1-5, a bottom 320 of the upper mold frame 300 is opened to have a size wider than an effective display area of the display unit 200. The bottom 320 has a border portion 310 and side walls are extended from ends of the border portion 310 to receive the display unit 200. A side wall at one end of the border portion 310 of the bottom 320 is opened so that a printed circuit board of the display unit 200 is bent toward one wall of the upper mold frame 300, and is easily guided to the rear surface of the lower mold frame 800.

First and second engaging holes 331 and 333 are formed through the wall of the upper mold frame 300 corresponding to the first wall 810 of the lower mold frame 800. The first and second engaging holes 331 and 333 are respectively engaged with the first and second engaging protuberances 861 and 863. Third and fourth engaging holes 335 and 337 are formed through the wall of the upper mold frame 300 corresponding to the fourth wall 816 of the lower mold frame 800. The third and fourth engaging holes 335 and 337 are respectively engaged with the third and fourth engaging protuberances 865 and 867. Also, a fifth engaging hole 339 is formed through the wall of the upper mold frame 300 corresponding to the second wall 812 of the lower mold frame 800. The fifth engaging groove 339 is engaged with the fifth engaging protuberance 869.

As described above, the upper mold frame 300 is combined with the lower mold frame 800 by engaging the first to fifth engaging protuberances 861, 863, 865, 867 and 869 of the lower mold frame 800 with the first to fifth engaging holes 331, 333, 335, 337 and 339 of the upper mold frame 300, respectively.

In addition, first and second guide grooves 340 and 341 are formed on the wall of the upper mold frame 300 corresponding to the first wall 810 of the lower mold frame 800 by partially removing the wall of the upper mold frame 300 to expose the first and second embossings 871 and 872. Third and fourth guide grooves 343 and 345 are formed on the wall of the upper mold frame 300 corresponding to the fourth wall 816 of the lower mold frame 800 by partially removing the wall of the upper mold frame 300 to expose the third and fourth embossings 873 and 874. Also, fifth and sixth guide grooves 347 and 349 are formed on the wall of the upper mold frame 300 corresponding to the second wall 812 of the lower mold frame 800 by partially removing the wall of the upper mold frame 300 to expose the fifth and sixth embossings 875 and 876. Hence, the first to eighth fixing protuberances 871a, 872a, 873a, 874a, 875a, 876a, 878 and 879 for fixing the top chassis 100 are sufficiently exposed from the upper mold frame 300.

Figure 6:
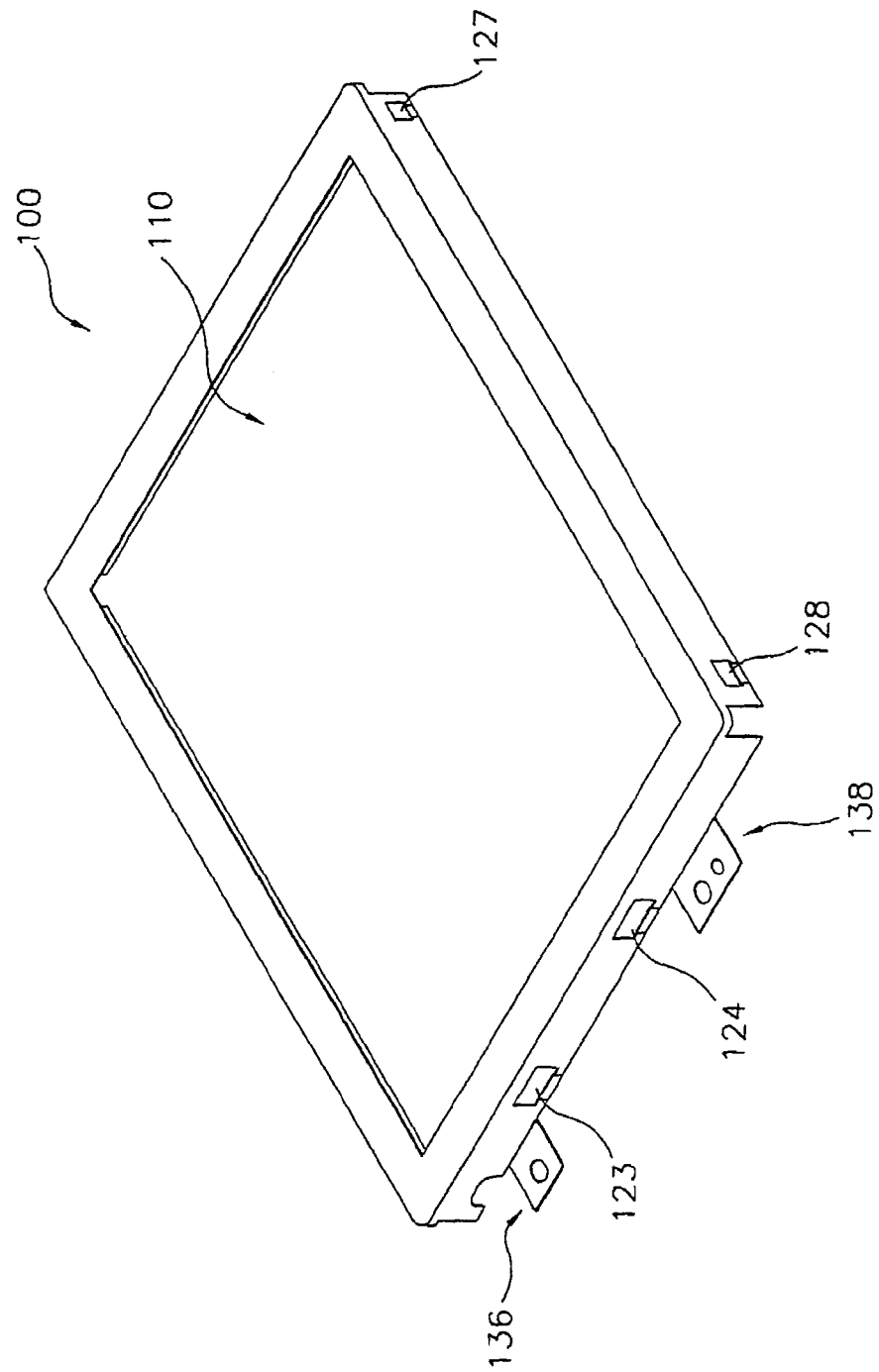
FIGS. 6 and 7 are a perspective view and a plan view for illustrating a top chassis shown in FIG. 1.
Figure 7:
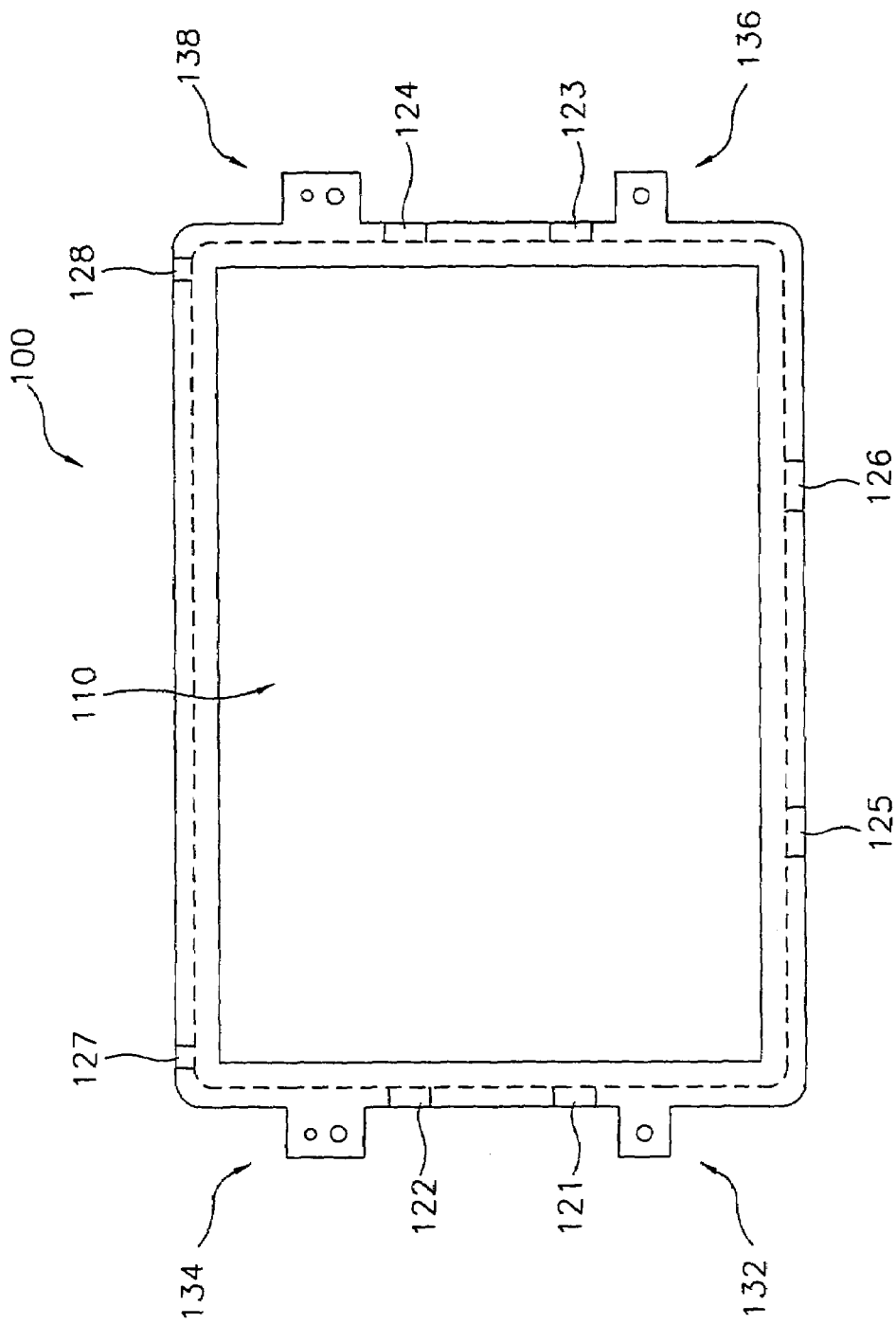

FIGS. 6 and 7 are respectively perspective and plan views for particularly illustrating the top chassis 100 shown in FIG. 1.

Referring to FIGS. 1-7, the bottom 110 of the top chassis 100 is partially opened to expose the effective display area of the display unit 200 and the top chassis 100 includes walls respectively corresponding to the first to fourth walls 810, 812, 814 and 816 of the lower mold frame 800. The top chassis 100 is combined with the lower mold frame 800 to fix the display unit 200 on the upper mold frame 300. For this purpose, first and second fixing holes 121 and 122 are formed through the wall of the top chassis 100 corresponding to the first wall 810 of the lower mold frame 800, and the first and second fixing holes 121 and 122 are respectively engaged with the first and second fixing protuberances 871a and 872a. Third and fourth fixing holes 123 and 124 are formed through the wall of the top chassis 100 corresponding to the fourth wall 816 of the lower mold frame 800, and the third and fourth fixing holes 123 and 124 are respectively engaged with the third and fourth fixing protuberances 873a and 874a.

Also, fifth and sixth fixing holes 125 and 126 are formed through the wall of the top chassis 100 corresponding to the second wall 812 of the lower mold frame 800, and the fifth and sixth fixing holes 125 and 126 are respectively engaged with the fifth and sixth fixing protuberances 875a and 876a. Seventh and eighth fixing holes 127 and 128 are formed through the wall of the top chassis 100 corresponding to the third wall 814 of the lower mold frame 800, and the seventh and eighth fixing holes 127 and 128 are respectively engaged with the seventh and eighth fixing protuberances 878 and 879.

As described above, when the first to eighth fixing protuberances 871a, 872a, 873a, 874a, 875a, 876a, 878 and 879 of the lower mold frame 800 are correspondently engaged with the first to eighth fixing holes 121, 122, 123, 124, 125, 126, 127 and 128 of the top chassis 100, the movement and the separation of the display unit 200 on the upper mold frame 300 can be prevented. In addition, a flexible printed circuit board of the display unit 200 is bent by means of the wall of the top chassis 100 correspondingly combined with the third wall 814 of the lower mold frame 800.

Portions of the walls of the top chassis 100 respectively corresponding to the first and fourth walls 810 and 816 of the lower mold frame 800, are perpendicularly protruded to form first to fourth fixing pieces 132, 134, 136 and 138.

The liquid crystal display device 1000 assembled as above-described is installed in a printed circuit board (not shown) having an inverter circuit and an A/D circuit for supplying a power to drive the display unit 200 and the back light assembly 900. The first to fourth fixing pieces 132, 134, 136 and 138 are combined with fixing holes formed on the printed circuit board, for example, by screws, combining the liquid crystal device 100 and the printed circuit board (not shown). Also, the first to fourth fixing pieces 132, 134, 136 and 138 function as ground pieces for grounding the top chassis 100 while combining with the fixing grooves of the printed circuit board (not shown). Such function of the fixing pieces 132, 134, 136 and 138 will be described later.

Hereinafter, structures will be described of the reflection plate 700, the light guide plate 600, the lamp 500 and the diffusion sheets 400 received between the upper mold frame 300 and the lower mold frame 800, as well as the structure of the display unit 200 received between the upper mold frame 300 and the top chassis 100.

Figure 8:
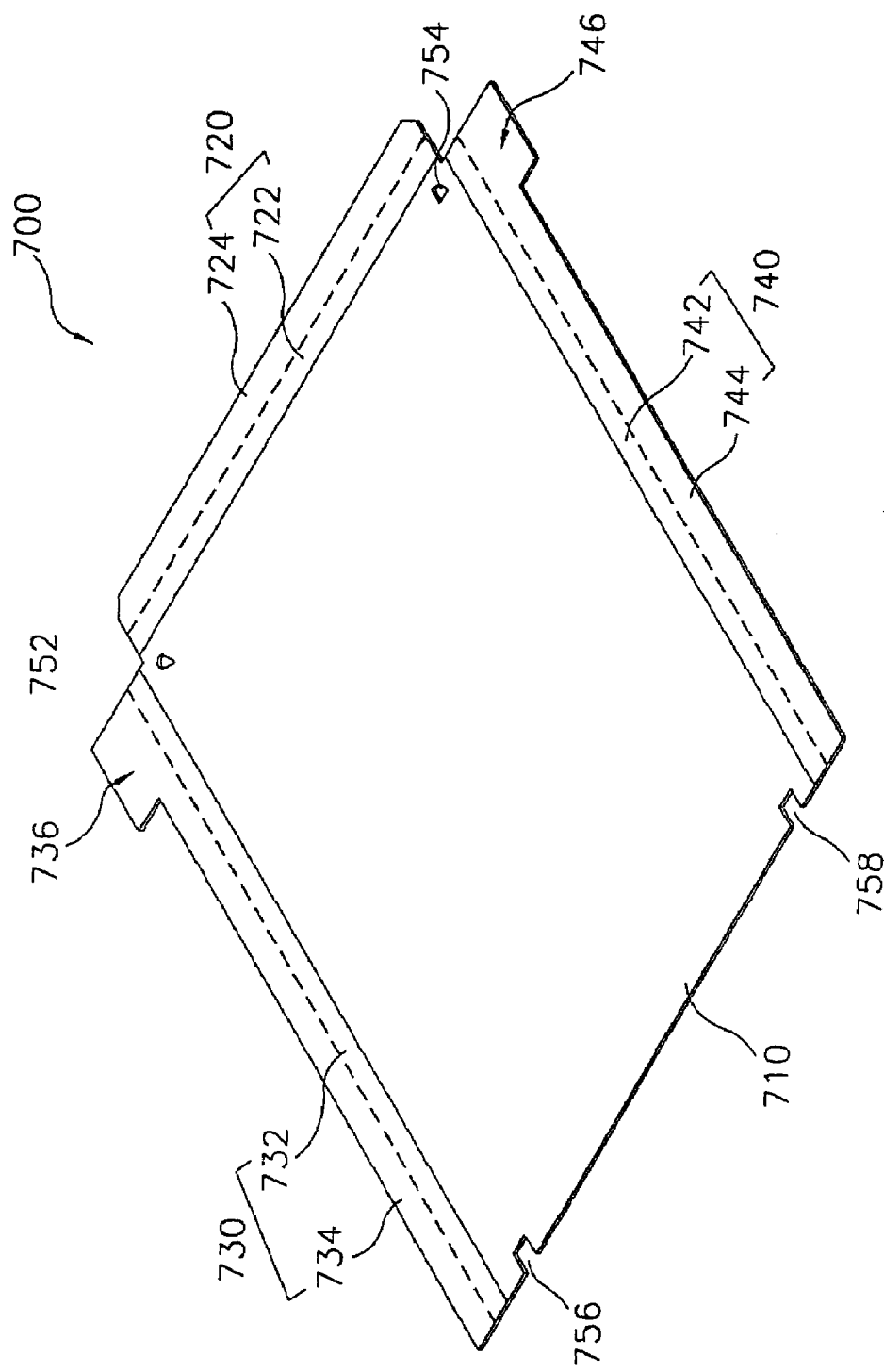
FIG. 8 is a perspective view for showing a reflection plate shown in FIG. 1.
Figure 9:
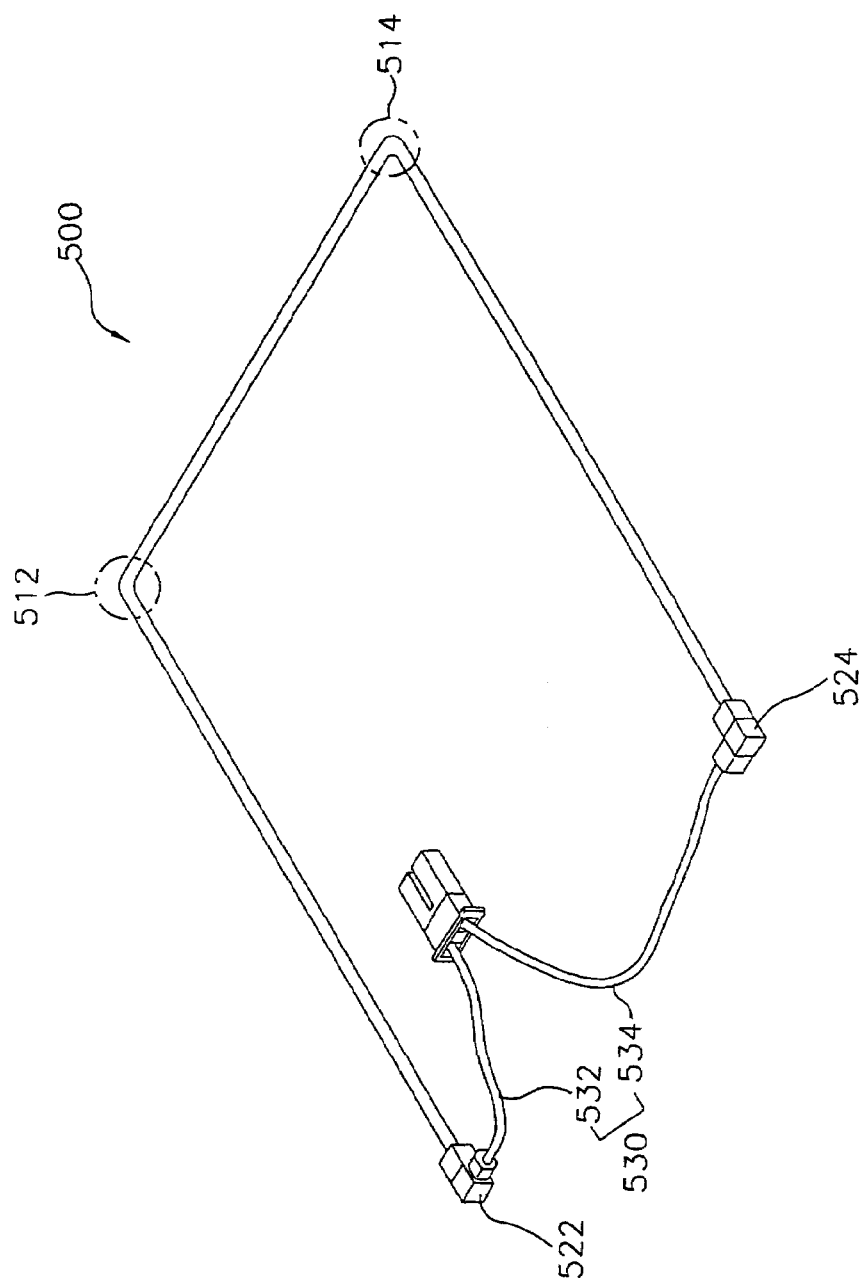
FIG. 9 is a perspective view for showing a light guiding plate shown in FIG. 1.
Figure 10:
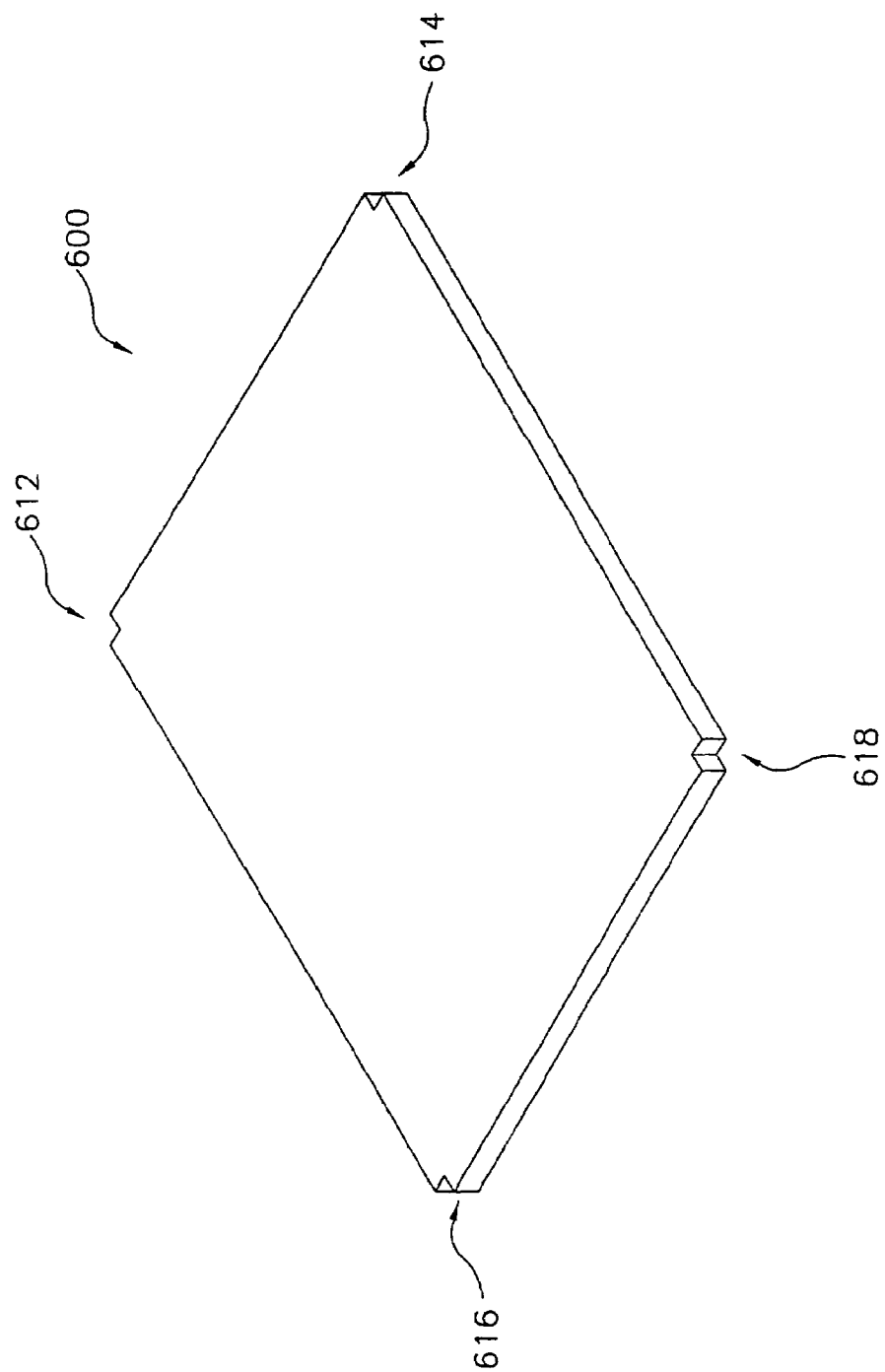
FIG. 10 is a perspective view for showing a lamp shown in FIG. 1.
Figure 11:
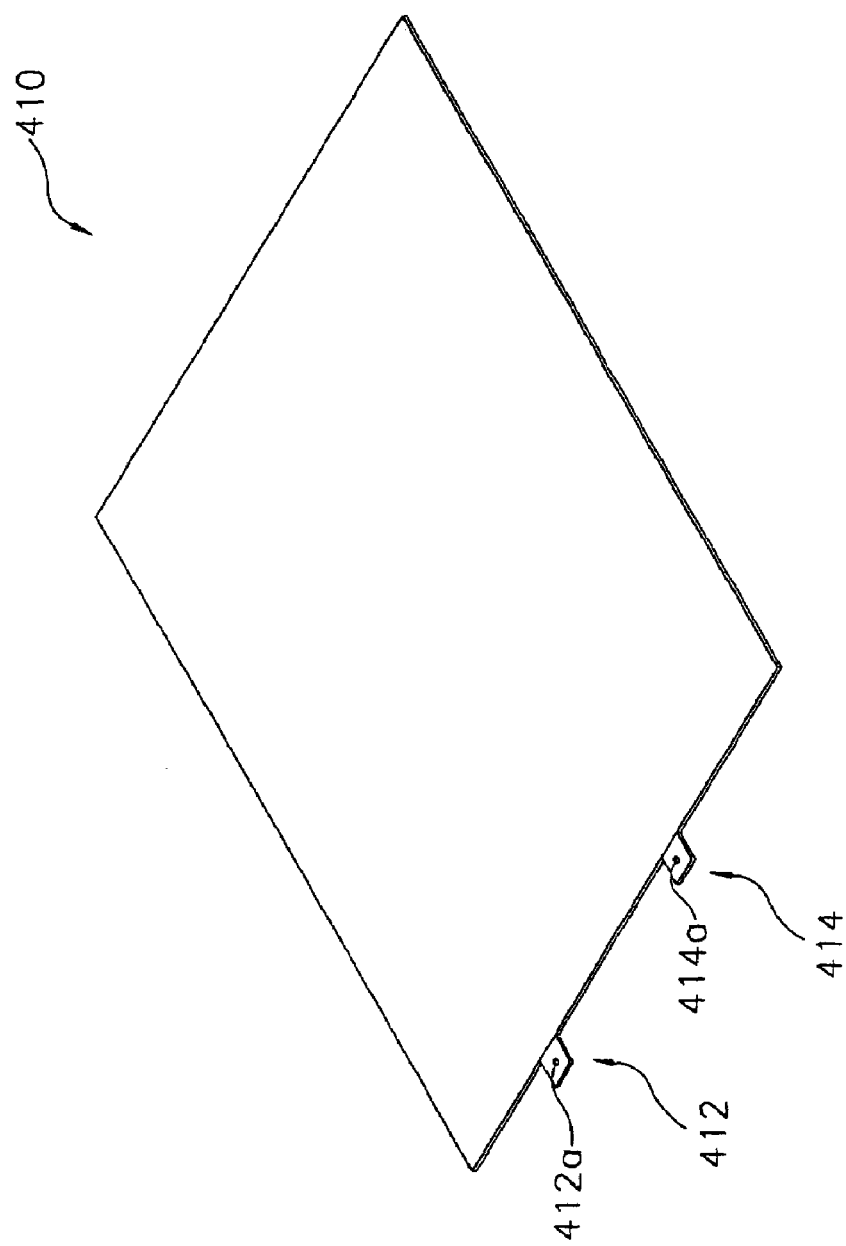
FIG. 11 is a perspective view for showing diffusion sheets shown in FIG. 1.
Figure 12:
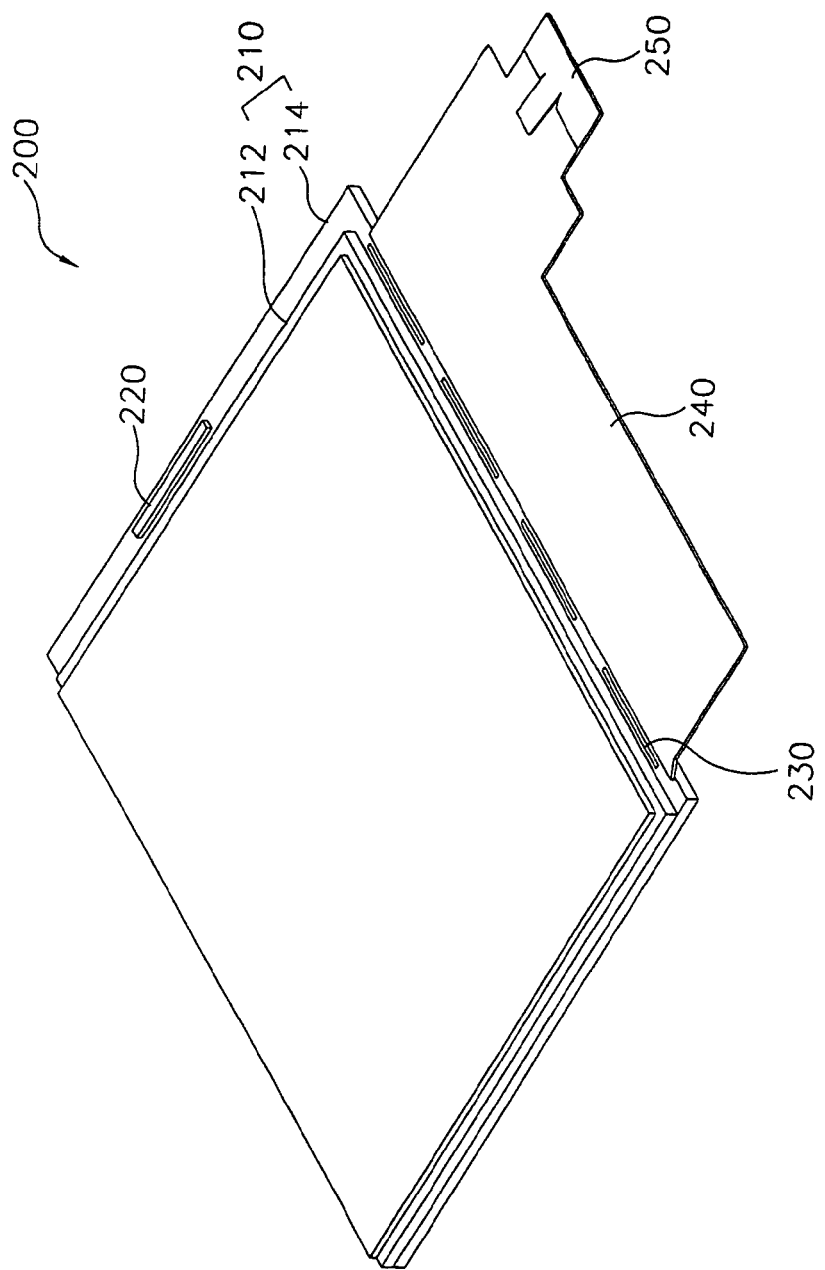
FIG. 12 is a perspective view for showing a display unit shown in FIG. 1.

FIG. 8 is a perspective view for showing the reflection plate shown in FIG. 1, FIG. 10 is a perspective view for illustrating the light guiding plate shown in FIG. 1, FIG. 9 is a perspective view for showing the lamp shown in FIG. 1, FIG. 11 is a perspective view for illustrating the diffusion sheets shown in FIG. 1, and FIG. 12 is a perspective view for showing the display unit shown in FIG. 1.

Referring to the figures and particularly to FIG. 8, the reflection plate 700 has a reflection bottom 710 for reflecting the light from the light guide plate 600 toward the display unit 200, and first, second and third reflection walls 720, 730 and 740 for reflecting the light generated form the lamp 500 toward the light guide plate 600.

The first, second and third reflection walls 720, 730 and 740 are respectively extended from the ends corresponding to the first to third walls 810, 812 and 814 of the lower mold frame 800. Particularly, the first to third reflection walls 720, 730 and 740 include first, second and third reflection side walls 722, 732 and 742 enclosing an outside of the lamp 500, and first, second and third reflection covers 724, 734 and 744 for covering the lamp 500. The first to third reflection side walls 722, 732 and 742 are perpendicular to the reflection bottom 710. The first to third reflection covers 724, 734 and 744 are bent from the first to third reflection side walls 722, 732 and 742 parallel with the reflection bottom 710. The second and third reflection covers 734 and 744 have first and second wings 736 and 746 protruded therefrom at an end portion adjacent to the first reflection wall 720.

First and second insertion holes 752 and 754 and first and second insertion grooves 756 and 758 are formed at four corners of the reflection bottom 710, and the first and second insertion holes and grooves 752, 754, 756 and 758 respectively correspond to the first to fourth protuberances 832, 834, 836 and 838 formed at the four corners of the bottom of the lower mold frame 800.

Referring to FIG. 9, the lamp 500 has the laid U shape having first and second bending portions 512 and 514. A first power supplying line 532 for applying a high voltage to the lamp 500 is electrically connected to one end of the lamp 500 and a second power supplying line 534 for applying a low voltage to the lamp 500 is electrically connected to the other end of the lamp 500. First and second lamp holders 522 and 524 are respectively combined with opposite ends of the lamp 500 to maintain the connection state between the lamp 500 and a power supplying line 530 including the first power supplying line 532 and the second power supplying line 534.

The method for mounting the lamp 500 on the lower mold frame 800 will be described later.

Referring to the figures, particularly to FIG. 10, the light guide plate 600 has a shape of a rectangular plate corresponding to the display unit 200 and ends of the light guide plate 600 have a same thickness to form an edge type. Printed patterns (not shown) are formed on the light guide plate 600 for increasing the reflection efficiency of the light emitted from the lamp 500, and an interval between two adjacent printed patterns gets smaller as the printed patterns are spaced more apart from the lamp 500.

Four corners of the light guide plate 600 are partially cut to prevent the light guide plate 600 from being moved when the light guide plate 600 is mounted on the lower mold frame 800, thereby forming first, second, third and fourth clamping jaws 612, 614, 616 and 618.

Referring to FIG. 11, the diffusion sheets 400 include a first diffusion sheet 410 and a second diffusion sheet (not shown) respectively having different visual angle directions with respect to the light. That is, the first diffusion sheet 410 diffuses the light emitted from the light guide plate 600 in the x-axis direction when the second diffusion sheet (not shown) diffuses the light emitted from the light guide plate 600 in the y-axis direction, so the visual angle of the image displayed through the display unit 200 can be enlarged as a whole.

The first diffusion sheet 410 has a shape identical to that of the second diffusion sheet 420. In particular, ends of the first and the second diffusion sheets 410 and 420 are respectively extended to form first and second protruding portions 412 and 414. Seventh and eighth engaging holes 412a and 414a engaged with the fifth and sixth protuberances 842 and 844 formed on the isolation wall 840 of the lower mold frame 800 are respectively formed in the first and second protruding portions 412 and 414.

Referring to FIG. 12, the display unit 200 for displaying the image corresponding to the light which is generated from the lamp 500 and passed through the light guide plate 600 and the diffusion sheets 400, is provided on the upper mold frame 300 that is disposed on the diffusion sheets 400.

The display unit 200 includes a liquid crystal display panel 210, a gate driver integrated circuit (IC) 220, a data driver integrated circuit (IC) 230, and a flexible printed circuit board 240 on which wiring patterns are formed for transmitting gate and data driving signals to the gate driver IC 220 and the data driver ICs 230 provided from a gate-and-data printed circuit board (not shown). The gate driver IC 220 is formed at one portion of the liquid crystal display panel 210 and the data driver integrated circuits 230 are formed at the other portion of the liquid crystal display panel 210. A signal transmitting line for transmitting the gate driving signal to the gate driver IC 220 is extended to the flexible printed circuit board 240 through an inactive region of the liquid crystal display panel 210. That is, the patterns of the signal transmitting line of the gate driver IC 220 and data driver ICs 230 are integrally formed on the flexible printed circuit board 240, and a connection terminal 250 is formed at the end of the flexible printed circuit board 240. The connection terminal 250 is electrically connected to the gate-and-data printed circuit boards of the printed circuit board (not shown) which is combined with the rear surface of the liquid crystal display device 1000.

The liquid crystal display panel 210 has a thin film transistor substrate 214, a color filter substrate 212 and a liquid crystal (not shown).

The thin film transistor substrate 214 includes a transparent glass substrate on which thin film transistors in a matrix shape are formed. A data line is connected to source terminals of the thin film transistors and a gate line is connected to the gate terminals of the thin film transistors. Also, a pixel electrode is connected to each of the drain terminals of the thin film transistors and the pixel electrode is generally formed of a transparent conductive material such as Indium Tin Oxide (ITO).

When electric signals are applied to the data and the gate lines, the electrical signals are transmitted to the source and the gate terminals of the thin film transistors, turning on or off the thin film transistors and outputting electrical signals for the formation of the pixel through the drain terminals of the thin film transistors.

The color filter substrate 212 is provided to face the thin film transistor substrate 214. RGB pixels are formed on the color filter substrate 212, for example, via a thin film processing, and give a predetermined color while the light passes through the color filter substrate 212. Common electrodes made of the ITO are coated on a front surface of the color filter substrate 212.

When the thin film transistors are turned on by applying a power source to the gate terminals and the source terminals of the thin film transistors of the thin film transistor substrate 214, an electric field is generated between the pixel electrodes and the common electrodes of the color filter substrate 212. The alignment angle of the liquid crystal injected between the thin film transistor substrate 214 and the color filter substrate 212 is changed according to the electric field, and then the light transmissivity is changed to obtain a desired pixel in accordance with the changed alignment angle of the liquid crystal.

To control the alignment angle and the alignment timing of the liquid crystal of the liquid crystal display panel 210, driving and timing signals applied to the gate and the data lines of the thin film transistor are provided from the gate-and-data printed circuit board (not shown) through the signal transmitting lines of the gate driver IC 220 and the data driver ICs 230. Namely, the gate-and-data printed circuit board (not shown) generates the gate driving and the data signals for driving the liquid crystal display 1000 and a plurality of timing signals for properly applying the gate driving and the data signals, and then the gate driving signal is applied to the gate line of the liquid crystal panel 210 through the gate driver IC 220 and the data signal is applied to the data line of the liquid crystal panel 210 through the data driver ICs 230.

Hereinafter, the assembled structure of the above-described liquid crystal display device will be described with reference to FIGS. 13 to 19.

Figure 13:
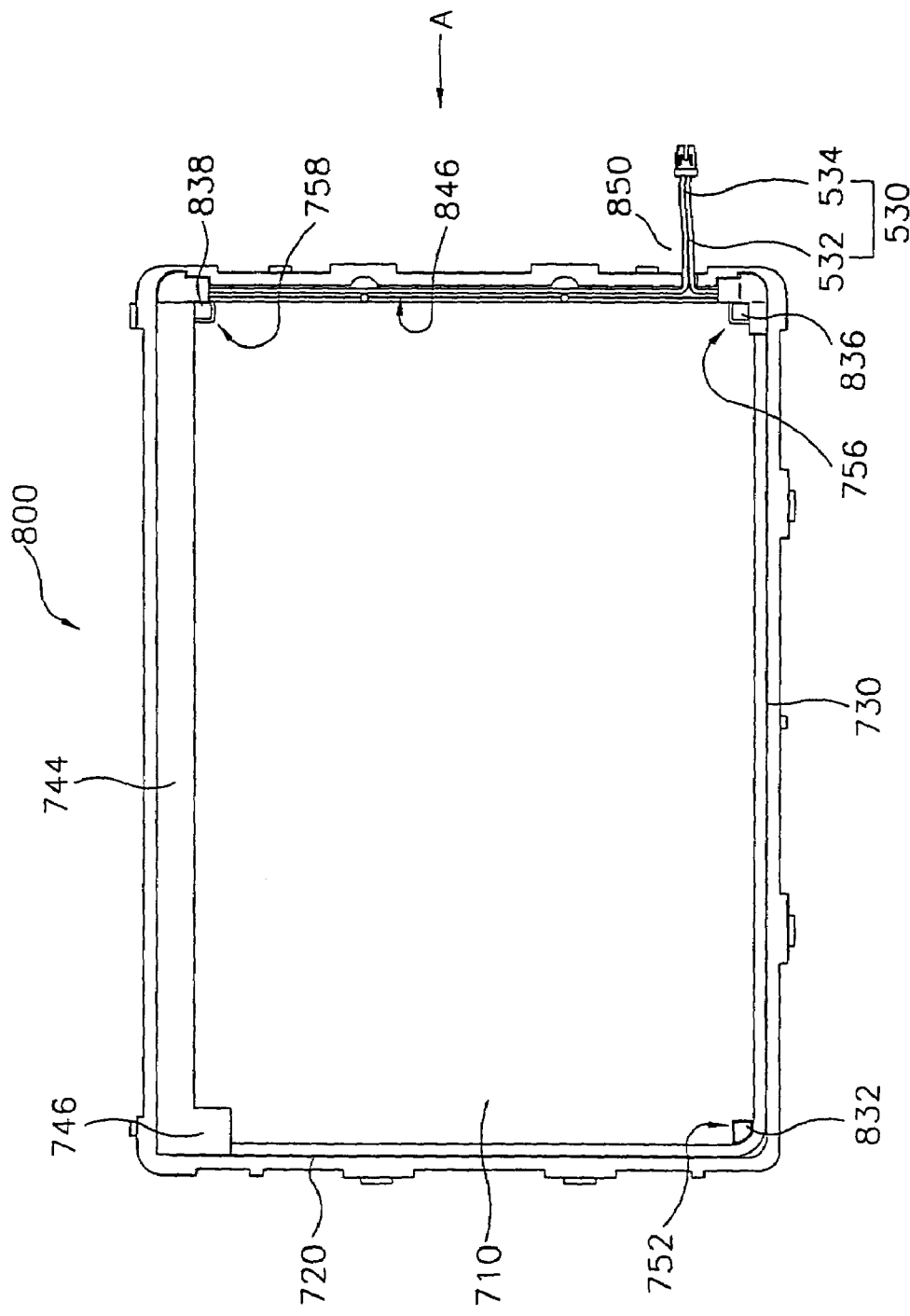
FIG. 13 is a plan view for illustrating an assembled structure of the lower mold frame, the reflection plate and the lamp shown in FIG. 1.
Figure 14:
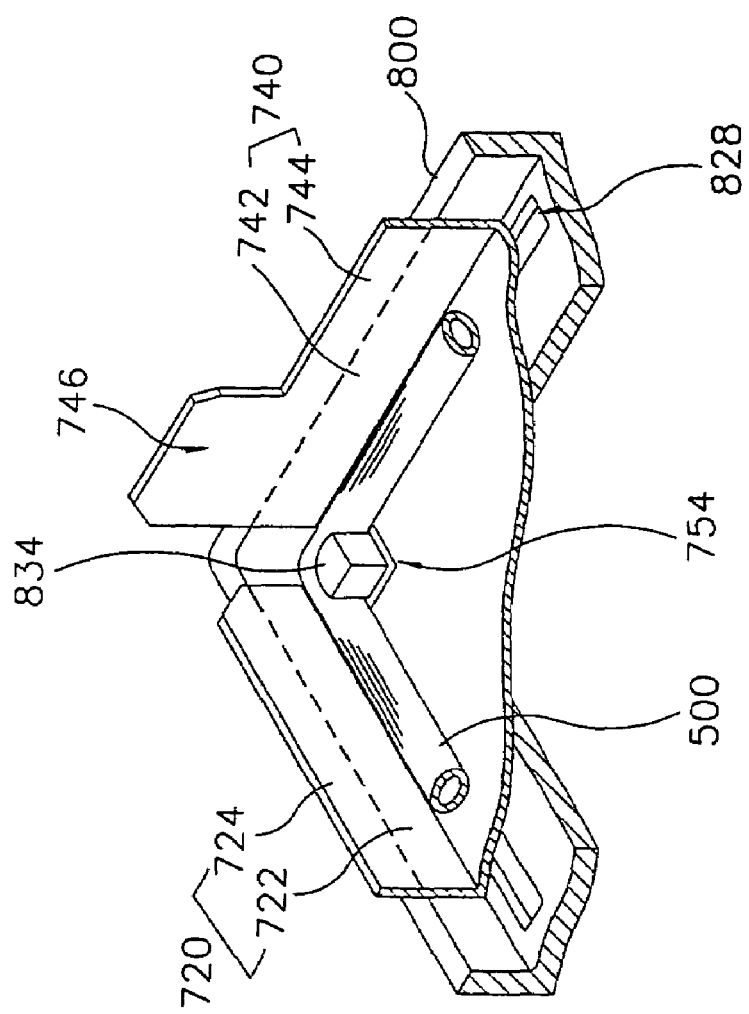
FIGS. 14 and 15 are partially cut perspective views for illustrating the assembled structure of the lower mold frame, the reflection plate and the lamp shown in FIG. 13.
Figure 15:
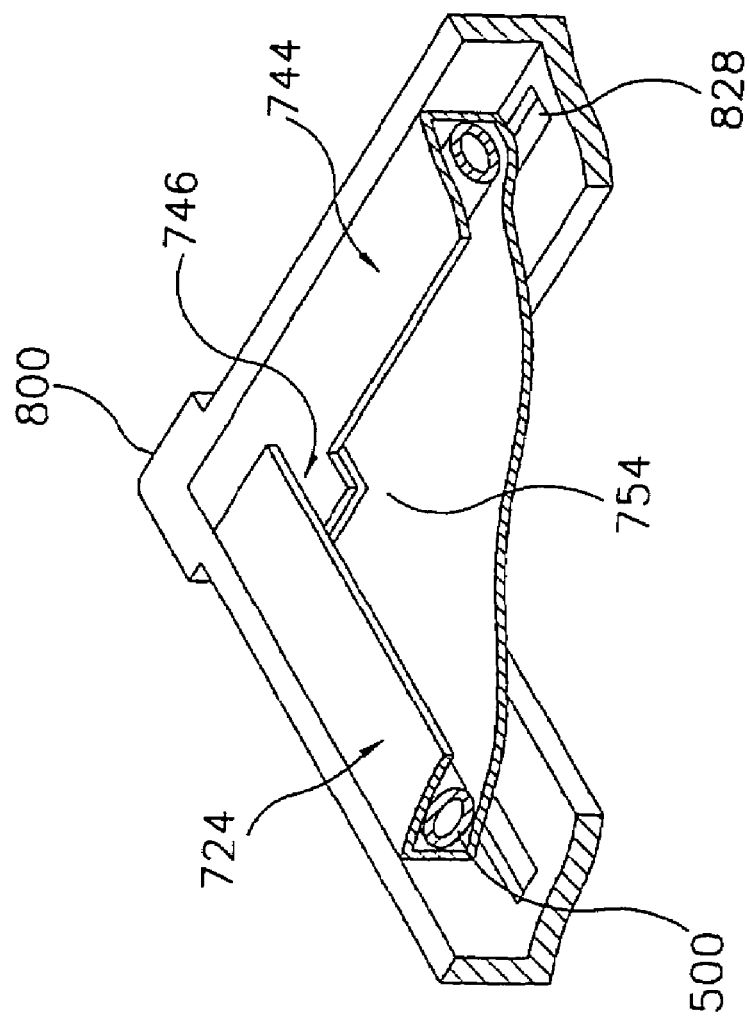

FIG. 13 is a plan view for showing the assembled structure in which the reflection plate and the lamp are assembled with the lower mold frame shown in FIG. 1 and FIGS. 14 and 15 are partially cut perspective views for illustrating the assembled structure of the upper mold frame, the reflection plate and the lamp shown in FIG. 13.

As shown in FIG. 13, the first to fourth protuberances 832, 834, 836 and 838 formed on the first to fourth bottoms 820, 822, 824 and 826 of the lower mold frame 800 respectively correspond to the first and second insertion holes and grooves 752, 754, 756 and 758 formed on the reflection bottom 710 of the reflection plate 700, thereby combining the reflection plate 700 with the lower mold frame 800.

The first to fourth protuberances 832, 834, 836 and 838 respectively penetrating the first and second insertion holes and grooves 752, 754, 756 and 758 prevent the reflection plate 700 received on the lower mold frame 800 from being moved. The first to third reflection walls 720, 730 and 740 of the reflection plate 700 are bent corresponding to the first to third side walls 810, 812 and 814 of the lower mold frame 800 in a direction perpendicular to the bottom of the lower mold frame 800.

The lamp 500 having the laid U shape is received in the lower mold frame 800 along the first to third side walls 810, 812 and 814 of the lower mold frame 800, after the reflection plate 700 is received in the lower mold frame 800. Particularly, the first bending portion 512 of the lamp 500 having the laid U shape is placed between the first protuberance 832 of the lower mold frame 800 and the first side wall 810 and the second side wall 812, and the second bending portion 514 of the lamp 500 having the laid U shape is placed between the second protuberance 834 of the lower mold frame 800, and the first side wall 810 and the third side wall 814. Also, the first lamp holder 522 of the lamp 500 is placed between the third protuberance 836 of the lower mold frame 800, and the second side wall 812 and the fourth side wall 816, and the second lamp holder 524 of the lamp 500 is placed between the fourth protuberance 838 of the lower mold frame 800, and the third side wall 814 and the fourth side wall 816.

As described above, when the lamp 500 is received in the lower mold frame 800, the position of the received lamp 500 generally corresponds to the openings 828 formed in the bottom of the lower mold frame 800. That is, the lamp 500 is mounted at the position corresponding to the openings 828 for radiating the heat generated from the lamp 500.

As shown in FIGS. 14 and 15, the first and second wings 736 and 746 formed on the second and third reflection covers 734 and 744 fully cover the first and second protuberances 832 and 834 when the first to third reflection covers 724, 734 and 744 are bent to cover the upper surface of lamp 500. Although not shown in FIGS. 14 and 15, the first and second clamping jaws 612 and 614 of the light guide plate 600 shown in FIG. 10 are covered by the first and second wings 736 and 746.

If the first and second wings 736 and 746 are not formed, the first and second protuberances 832 and 834, and the first and second clamping jaws 612 and 614 are not completely covered by the first to third reflection covers 724, 734 and 744, so the light generated from the lamp 500 may be leaked.

Alternatively, both ends of the first reflection cover 724 are extended in the same manner as in the first and the second wings 736 and 746. The extended ends of the first reflection cover 724 may replace the first and second wings 736 and 746 of the second and the third reflection covers 734 and 744 covering the first and second protuberances 832 and 834 and the first and the second clamping jaws 612 and 614 of the light guide plate 600.

Figure 16:
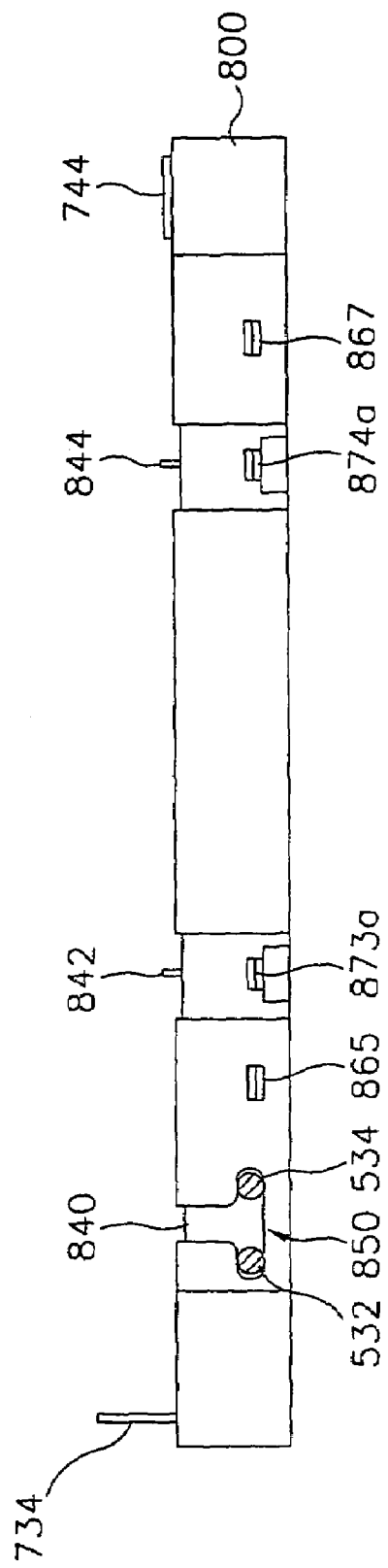
FIG. 16 is a side view taken in a direction of A for showing the liquid crystal display device shown in FIG. 13.
Figure 17:
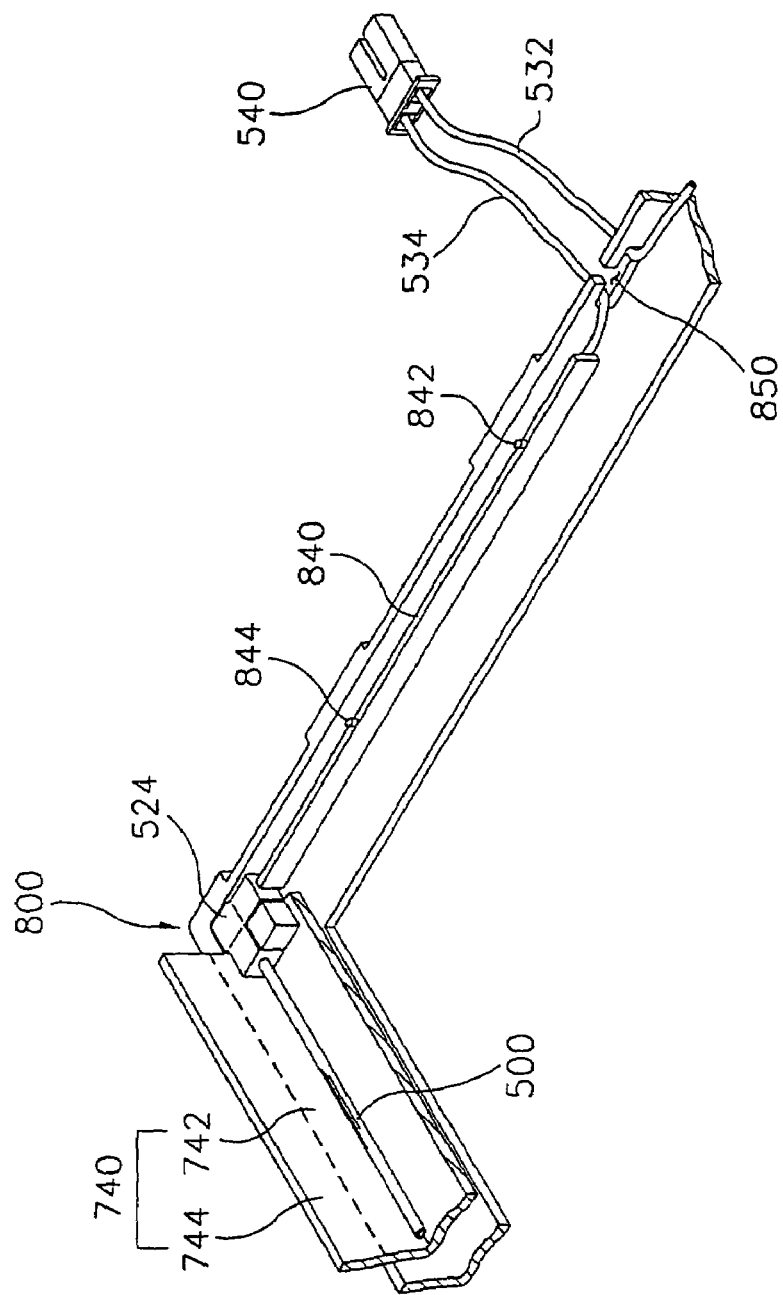
FIG. 17 is a partially cut perspective view for illustrating an assembled structure of the lower mold frame and a power supplying line shown in FIG. 13.

FIG. 16 is a side view for showing the liquid crystal display device shown in FIG. 13 along the direction of A and FIG. 17 is partially cut perspective view for illustrating the assembled structure of the lower mold frame and the power supplying line shown in FIG. 13.

The first and second power supplying lines 532 and 534 are electrically connected to opposite ends of the lamp 500 as shown in FIG. 9. The first power supplying line 532 provides the high voltage to one end of the lamp 500 and the second power supplying line 534 maintains the other end of the lamp 500 as a ground level.

The first and second power supplying lines 532 and 534 are guided to the leader groove 850 through the guide passage 846 formed by the isolation wall 840 and the fourth side wall 816 of the lower mold frame 800 as shown in FIG. 17. In addition, the first and second power supplying lines 532 and 534 are inserted in the leader groove 850 to be extended toward outside. If the leader groove 850 is adjacently formed to a central portion of the fourth side wall 816 or the fourth protuberance 838, the first power supplying line 532 for applying the high voltage from outside to the lamp 500 may be equal to or longer than the second power supplying line 534. So, it is preferable that the leader groove 850 is adjacently formed to the third protuberance 836 on the fourth side wall 816 as shown in FIG. 2.

In a case where the first power supplying line 532 for applying the high voltage to the lamp 500 is longer than the second power supplying line 534, circuit parts of the liquid crystal display device 1000 adjacent to the first power supplying line 532 may be mis-operated by the heat generated due to the high voltage provided through the first power supplying line 532. Therefore, as shown in FIGS. 2, 16 and 17, the second power supplying line 534 maintained as the ground level is longer than the first power supplying line 532, and the leader groove 850 is formed adjacent to the third protuberance 836 on the fourth side wall 816.

The assembly process and the assembled structure of the liquid crystal display device shown in FIG. 1 will be described with reference to FIG. 18 to 20.

Figure 18:
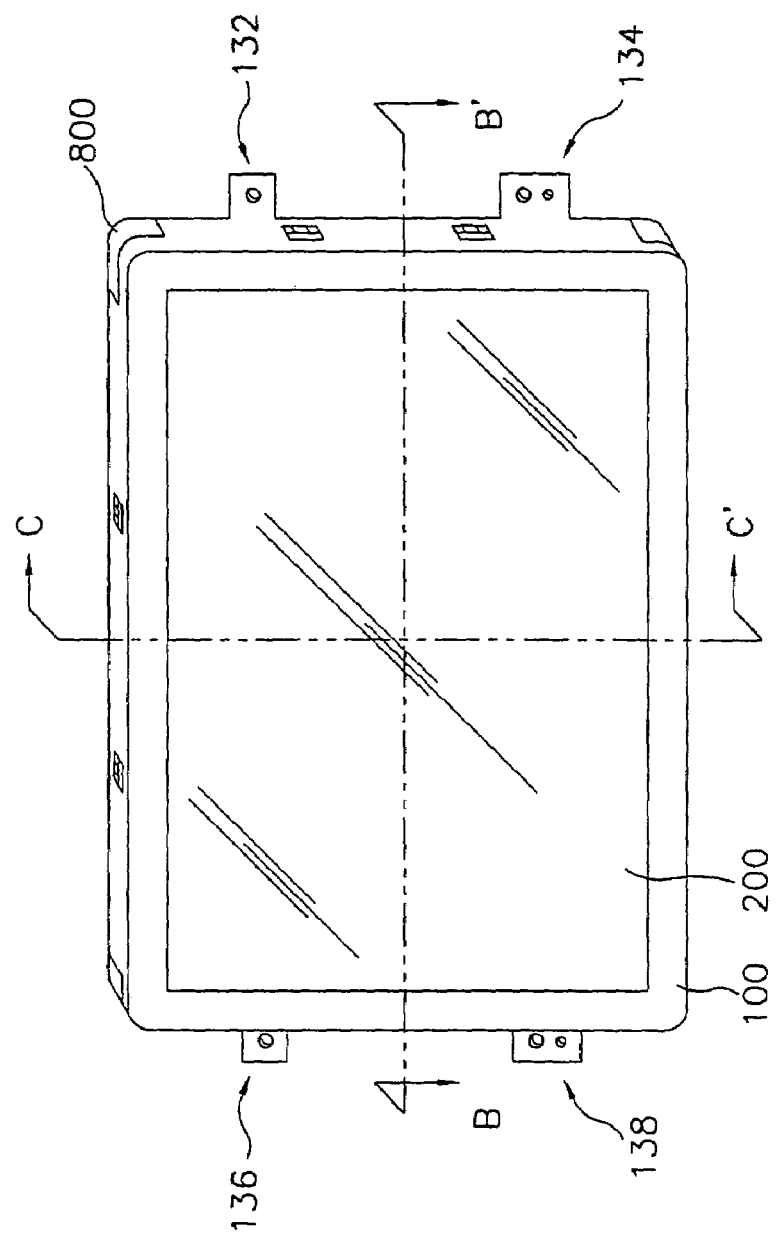
FIG. 18 is a perspective view for showing an appearance of the assembled liquid crystal display device shown in FIG. 1.
Figure 19:
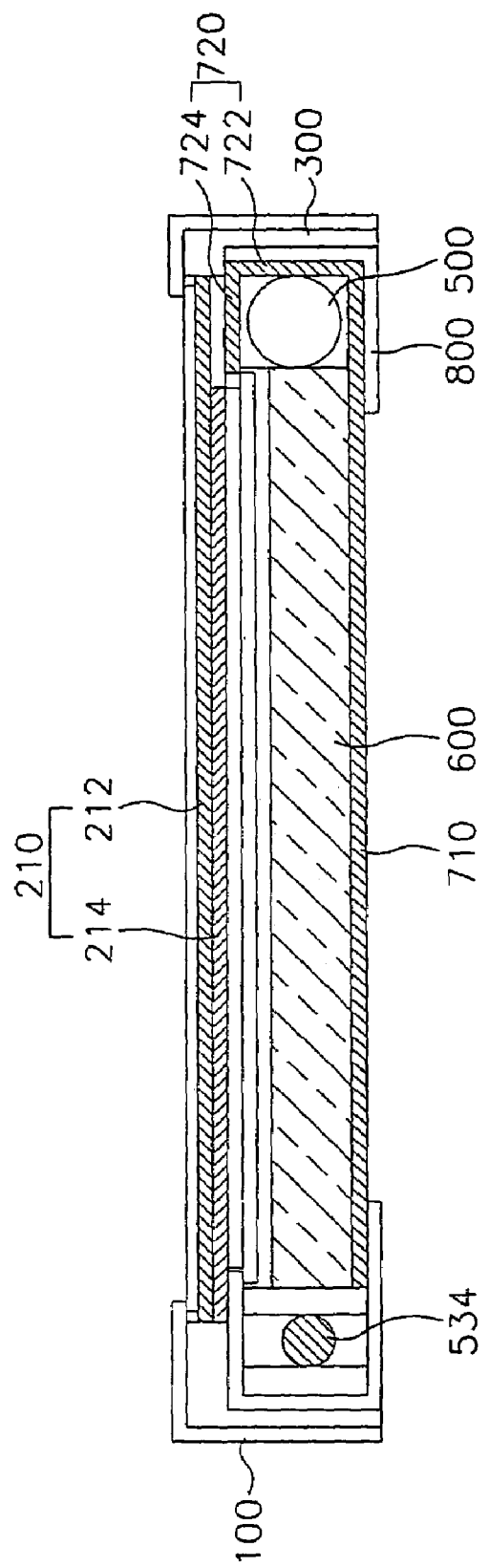
FIG. 19 is a cross-sectional view taken along a line of B-B' for illustrating an assembled structure of the liquid crystal display device shown in FIG. 18.
Figure 20:
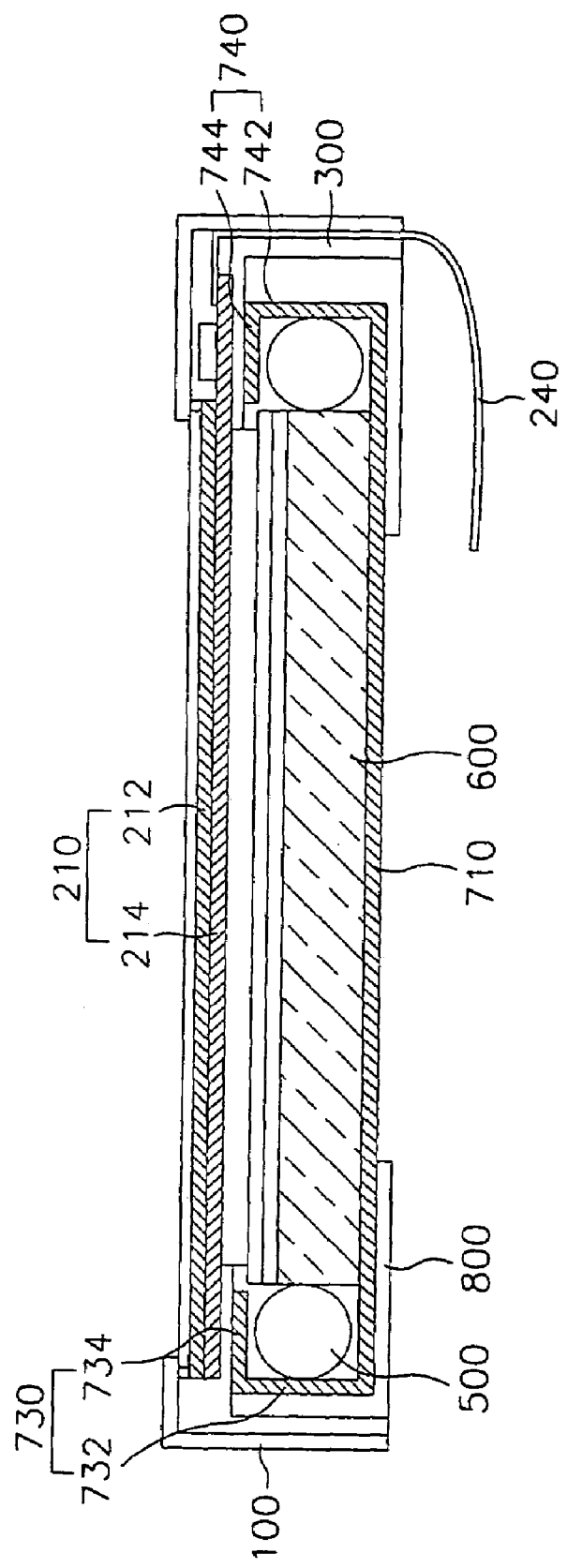
FIG. 20 is a cross-sectional view taken along a line of C-C' for illustrating the assembled structure of the liquid crystal display device shown in FIG. 18.

FIG. 18 is a perspective view for showing an appearance of the assembled liquid crystal display device shown in FIG. 1 after the liquid crystal display device is assembled, FIG. 19 is a cross-sectional view taken along B-B' for illustrating the assembled structure of the liquid crystal display device shown in FIG. 18, and FIG. 20 is a cross-sectional view taken along C-C' for illustrating the assembled structure of the liquid crystal display device shown in FIG. 18.

After the reflection plate 700, the lamp 500, the light guide plate 600 and the diffusion sheets 400 are successively received in the lower mold frame 800 shown in FIG. 13, the upper mold frame 300 is combined with the lower mold frame 800. Subsequently, the display unit 200 is mounted on the upper mold frame 300 and the top chassis 100 is combined with the lower mold frame 800, thereby completing the liquid crystal display device shown in FIG. 18.

Hereinafter, the assembly process and the assembled structure of the liquid crystal display device shown in FIG. 18 will be described with reference to FIGS. 19 and 20.

After the reflection plate 700 and the lamp 500 are received in the lower mold frame 800, the light guide plate 600 is mounted on the reflection bottom 710 of the reflection plate 700 so that the first to fourth clamping jaws 612, 614, 616 and 618 are respectively coupled with the first to fourth protuberances 832, 834, 836 and 838. The first to fourth protuberances 832, 834, 836 and 838 prevent the lamp 500 and the light guide plate 600 from being moved and the lamp 500 from being damaged due to the movement of the light guide plate 600.

Then, the diffusion sheets 400 are placed on the light guide plate 600. The diffusion sheets 400 are guided to a proper position by inserting the fifth and sixth protuberances 842 and 844 of the isolation wall 840 into the seventh and eighth engaging holes 412a and 414a respectively formed on the first and second protruding portions 412 and 414 as described above. The first and second power supplying lines 532 and 534 of the lamp 500 are already extended to outside through the guide passage 846 and the leader groove 850.

Also, the fifth and sixth protuberances 842 and 844 of the isolation wall 840 are formed to be protruded from the guide passage 846 to prevent the first and second power supplying lines 532 and 534 received in the guide passage 846 from separating from the guided passage 846. Alternatively, for pressing the first and second power supplying lines 532 and 534, protruding portions can be formed at predetermined portions of the isolation wall 840, thereby preventing the first and second power supplying lines 532 and 534 from being separated from the isolation wall 840.

As shown in FIGS. 19 and 20, the first to third reflection covers 724, 734 and 744 are bent to cover the upper surface of the lamp 500. The upper mold frame 300 is fixedly combined with the lower mold frame 800 by respectively engaging the first to fifth engaging holes 331, 333, 335, 337 and 339 formed on the side wall of the upper mold frame 300 with the first to fifth engaging protuberances 861, 863, 865, 867 and 869. Also, the reflection plate 700, the light guide plate 600, the lamp 500 and the diffusion sheets 400 can be stably maintained between the upper mold frame 300 and the lower mold frame 800. The bottoms of the diffusion sheets 400 are exposed by the opened bottom of the upper mold frame 300.

Subsequently, after the display unit 200 is mounted on the upper mold frame 300, the top chassis 100 is combined with the lower mold frame 800 so that the top chassis 100 pressurizes a predetermined portion of end portions of the display unit 200.

The top chassis 100 is fixedly combined with the lower mold frame 800 by respectively combining the first to eighth fixing holes 121, 122, 123, 124, 125, 126, 127 and 128 formed through the side wall of the top chassis 100 with the first to eighth fixing protuberances 871a, 872a, 873a, 874a, 875a, 876a, 878 and 879 formed on the lower mold frame 800.

The above-mentioned liquid crystal display device 1000 requires a driving power and an image data signal for performing its own function.

It will be described that the printed circuit board having an inverter circuit for providing the driving power and a data converting circuit (A/D circuit) for providing the image data signal and a case for receiving the liquid crystal display device with reference to FIGS. 21 and 22.

Figure 21:
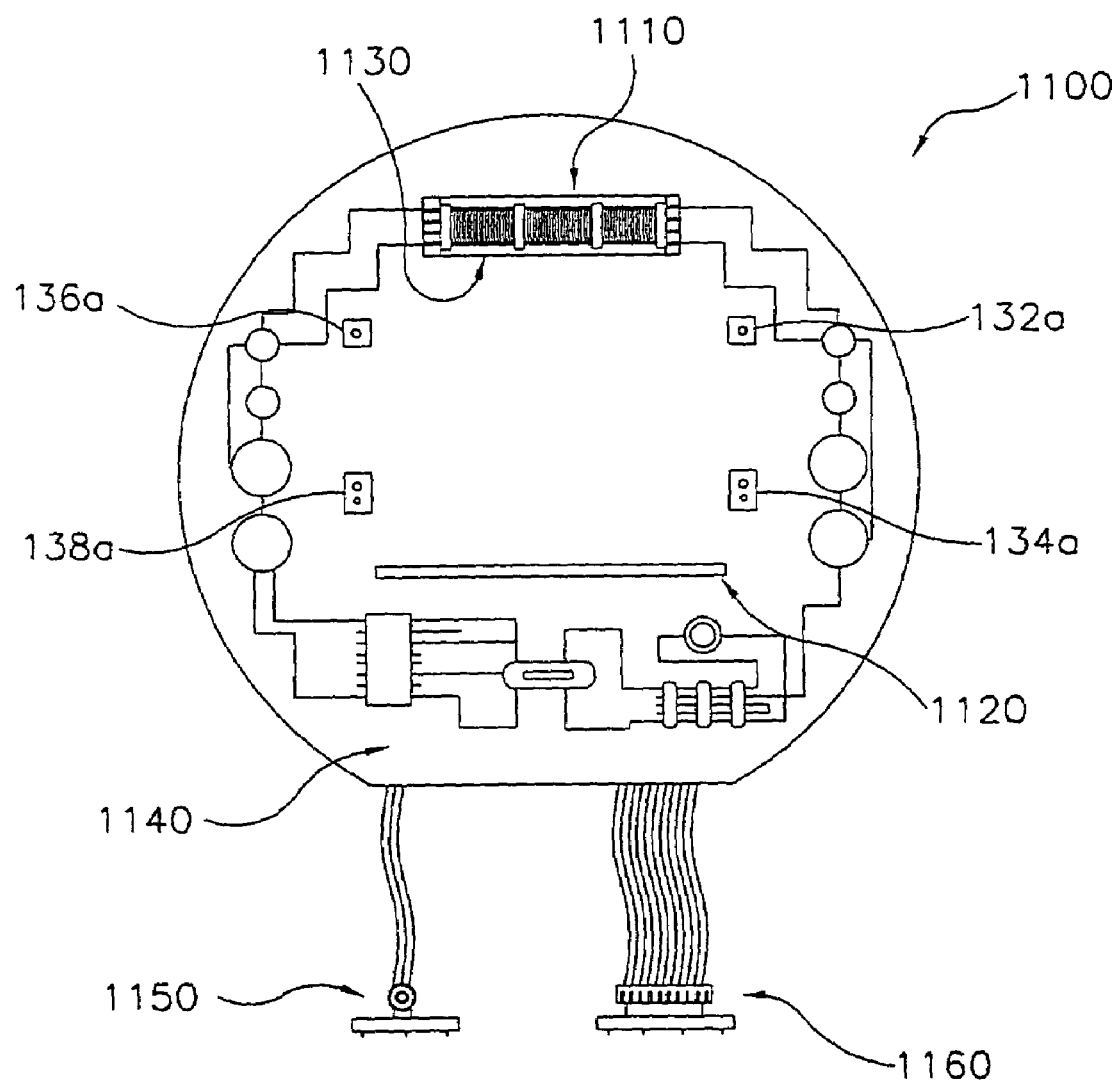
FIG. 21 is a plan view for showing a printed circuit board for controlling an operation of the liquid crystal display device shown in FIG. 18.
Figure 22:
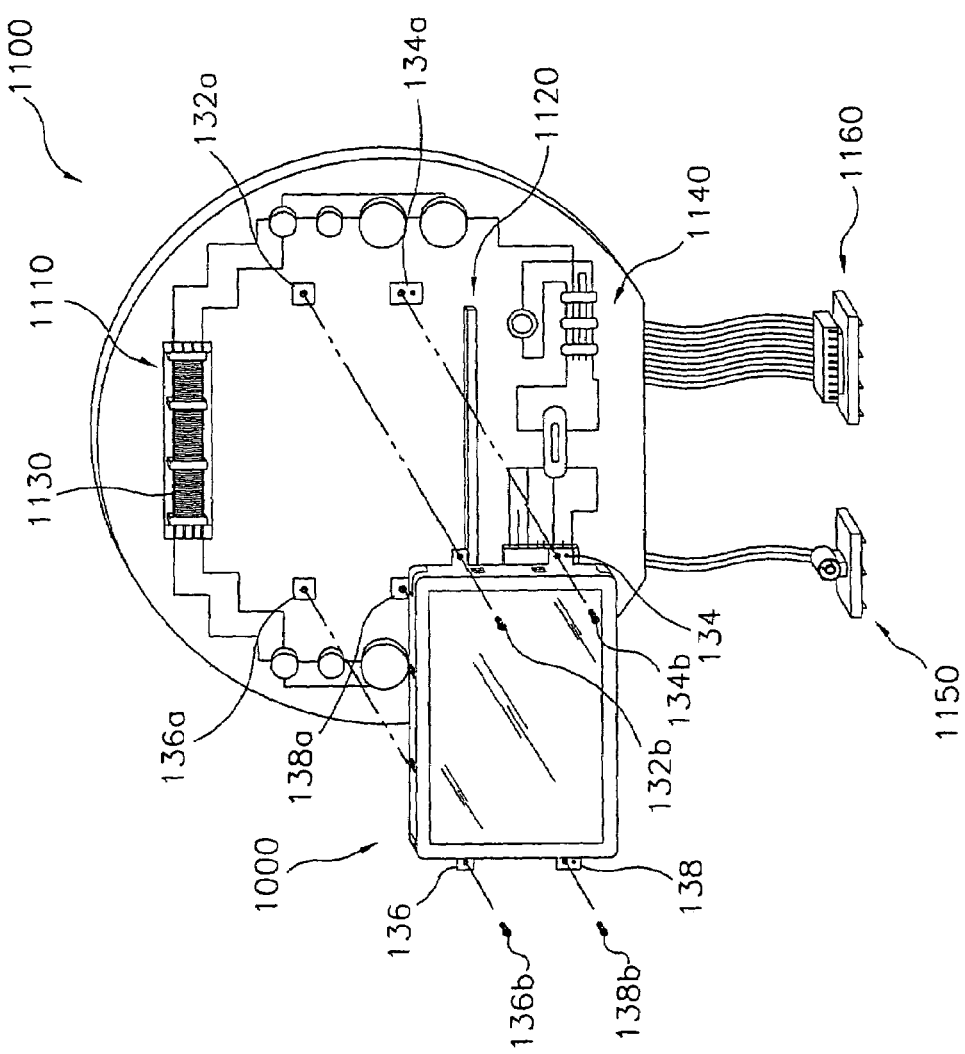
FIG. 22 is a perspective view for illustrating an assembled structure of the liquid crystal display device shown in FIG. 18 and the printed circuit board shown in FIG. 21.

FIG. 21 is a plan view for showing the printed circuit board for controlling the operation of the liquid crystal display device shown in FIG. 18, and FIG. 22 is a perspective view for illustrating the liquid crystal display device shown in FIG. 18 assembled with the printed circuit board shown in FIG. 21.

Referring to FIGS. 21 and 22, first, second, third and fourth ground patterns 132a, 134a, 136a and 138a are formed on the printed circuit board 1100 corresponding to the first, second, third and fourth fixing pieces 132, 134, 136 and 138 of the top chassis 100.

Also, the printed circuit board 1100 is partially removed so that blind holes corresponding to penetrating holes formed through the first to fourth fixing pieces 132, 134, 136 and 138 are formed in the first to fourth ground patterns 132a, 134a, 136a and 138a.

The upper and the lower portions of the printed circuit board 1100 are cut to form first and second receiving portions 1110 and 1120 on upper face and lower faces of the printed circuit board 1100.

A transformer 1130 of the inverter circuit is received in the first receiving portion 1110 and the transformer 1130 of the inverter circuit provides a predetermined voltage level to the lamp 500 and the display unit 200 after it receives the driving voltage for the liquid crystal display device from outside and converts the driving voltage to the predetermined voltage level. For this purpose, a power terminal 1150 is electrically connected to the lower portion of the printed circuit board 1100 for providing the driving voltage from outside to the transformer 1130.

When the liquid crystal display device 1000 is combined with the printed circuit board 1100, the flexible printed circuit board 240 of the display unit 200, which is bent toward a rear side of the lower mold frame 800, is guided to the lower face of the printed circuit board 1100 through the second receiving portion 1120 according to the combination of the top chassis 100 and the lower mold frame 800.

The connection terminal 250 of the flexible printed circuit board 240 is connected to a connector (not shown) disposed on the lower face of the printed circuit board 1100 for providing the image data signal and the driving power for the display unit 200. To achieve this performance, a data terminal 1160 is connected to the lower portion of the printed circuit board 1100. The data terminal 1160 receives the image data signal from outside, and then provides the image data signal to the printed circuit board 1100. In addition, an A/D circuit 1140 is installed on a predetermined portion of the printed circuit board 1100. The A/D circuit 1140 converts the image data signal having an analogue type inputted through the data terminal 1160 into a digital image data signal, and then provides the digital image signal to the connector connected to the connection terminal 250.

As shown in FIG. 22, the liquid crystal display device 1000 is fixed on the printed circuit board 1100 by first, second, third and fourth screws 132b, 134b, 136b and 138b which are inserted into the penetrating holes of the first to fourth fixing pieces 132, 134, 136 and 138 and are engaged with the blind holes of the first to fourth ground patterns 132a, 134a, 136a and 138a.

Figure 23:
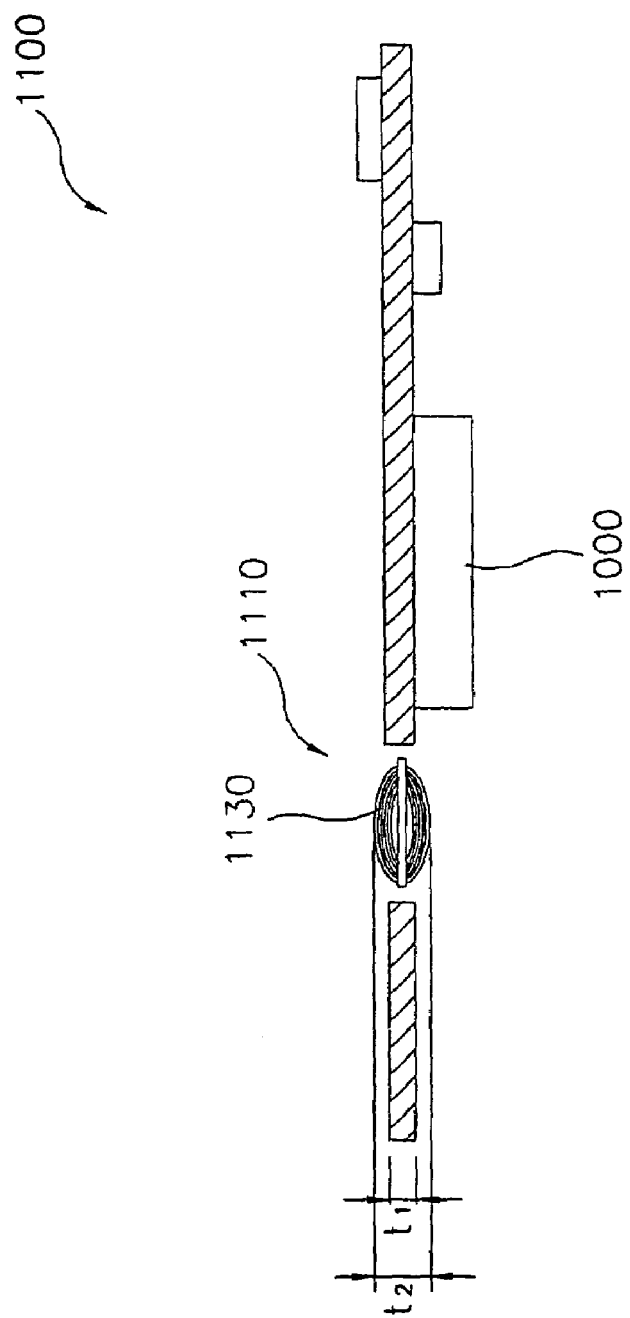
FIG. 23 is a cross-sectional view for showing an installation structure of a transformer shown in FIG. 22.

FIG. 23 is a cross-sectional view for illustrating the transformer shown in FIG. 22 which is installed in the printed circuit board.

To install the transformer 1130 of the inverter circuit, the first receiving portion 1110 having a predetermined size is formed through the printed circuit board 1100. The transformer 1130 is received into the first receiving portion 1110, thereby minimizing the thickness of the printed circuit board 1100. That is, the overall thickness of the printed circuit board 1100 on which various circuit parts are installed increases as the thickness "t2" of the transformer 1130 is added to the thickness of "t1" of the printed circuit board 1100 when the transformer 1130 is installed on the printed circuit board 1100. However, when the transformer 1130 is received in the first receiving portion 1110 after an opening is formed in the printed circuit board 1100 as the first receiving portion 1110, the overall thickness of the printed circuit board 1100 having the transformer 1130 thereon is reduced as much as the thickness of "t1". Thus, the height of the transformer 1130 received in the first receiving portion 1110 is lower than that of the liquid crystal display device 1000 installed on the printed circuit board 1100, thereby reducing the overall thickness of the printed circuit board 1100.

The power terminal 1150 and data terminal 1160 are installed on different printed circuit boards as shown in FIG. 21.

Figure 24:
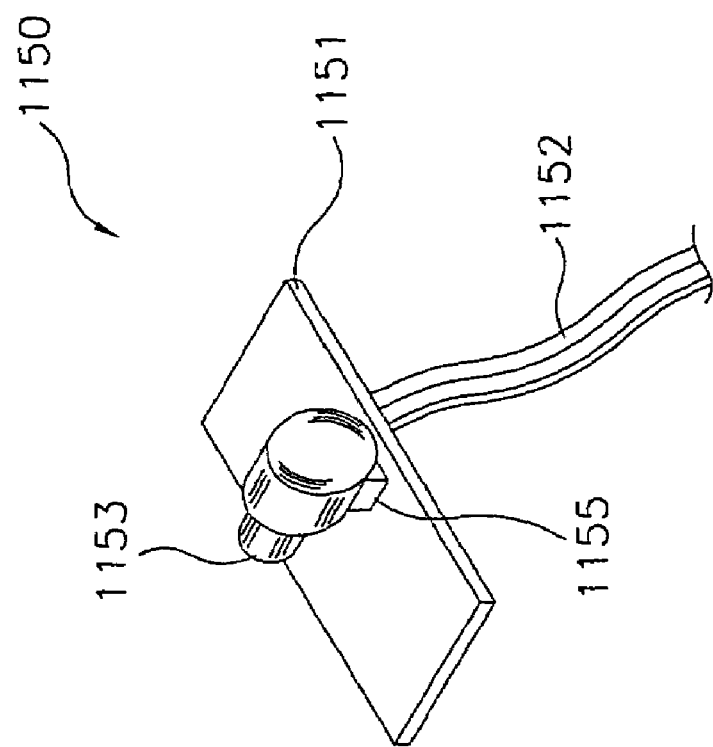
FIGS. 24 and 25 are perspective views for illustrating a power terminal and a data terminal shown in FIG. 21.
Figure 25:
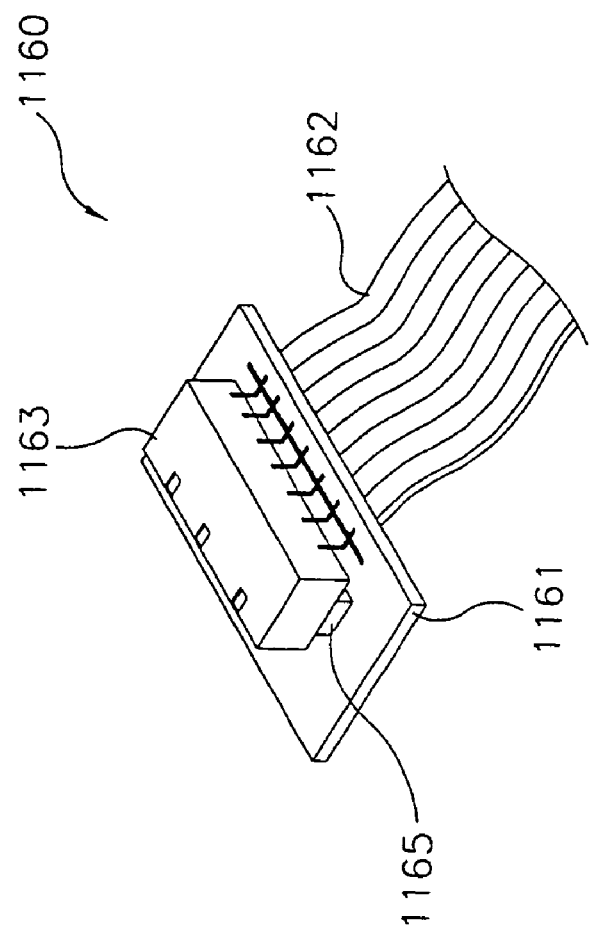

FIGS. 24 and 25 are perspective views for showing the structures of the power and the data terminals shown in FIG. 21.

Referring to FIG. 24, the power terminal 1150 includes a first printed circuit board 1151 which is electrically connected to the printed circuit board 1100 through a first signal transmitting line 1152, and a first connector 1153 having a first neck 1155 installed on the first printed circuit board 1151.

Referring to FIG. 25, the data terminal 1160 includes a second printed circuit board 1161 which is electrically connected to the printed circuit board 1100 through a second signal transmitting line 1162, and a second connector 1163 having a second neck 1165 installed on the second printed circuit board 1161. The power and data terminals 1150 and 1160 are separately installed in a case of the liquid crystal display device 1000.

That is, the first connector 1153 receiving the driving power from outside and the second connector 1163 receiving the image data signal are separately installed on the first and second printed circuit boards 1151 and 1161, respectively. Such a separate installation is advantageous as described below.

Figure 26:
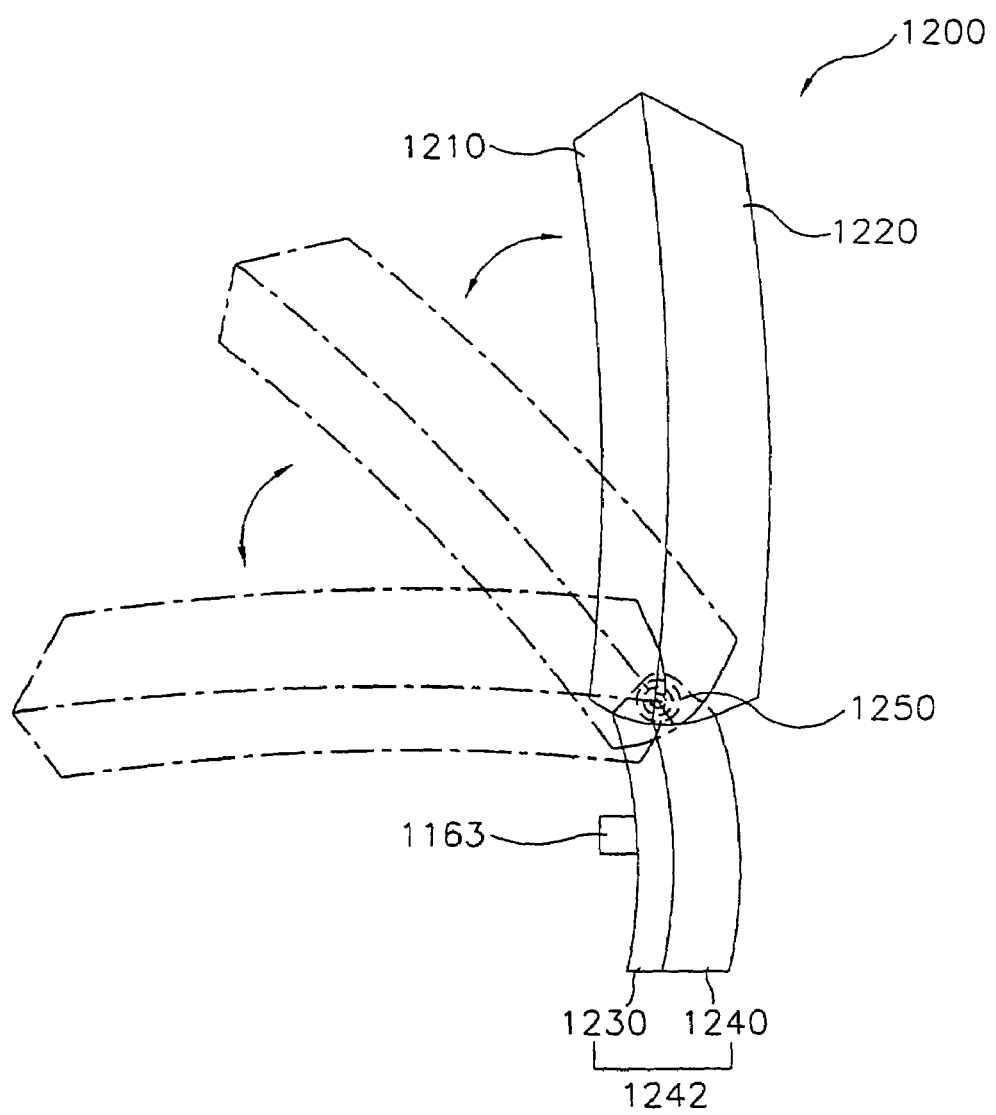
FIGS. 26 and 27 are a perspective view and a plan view for showing a case in which the liquid crystal display device is combined with the printed circuit board shown in FIG. 22.
Figure 27:
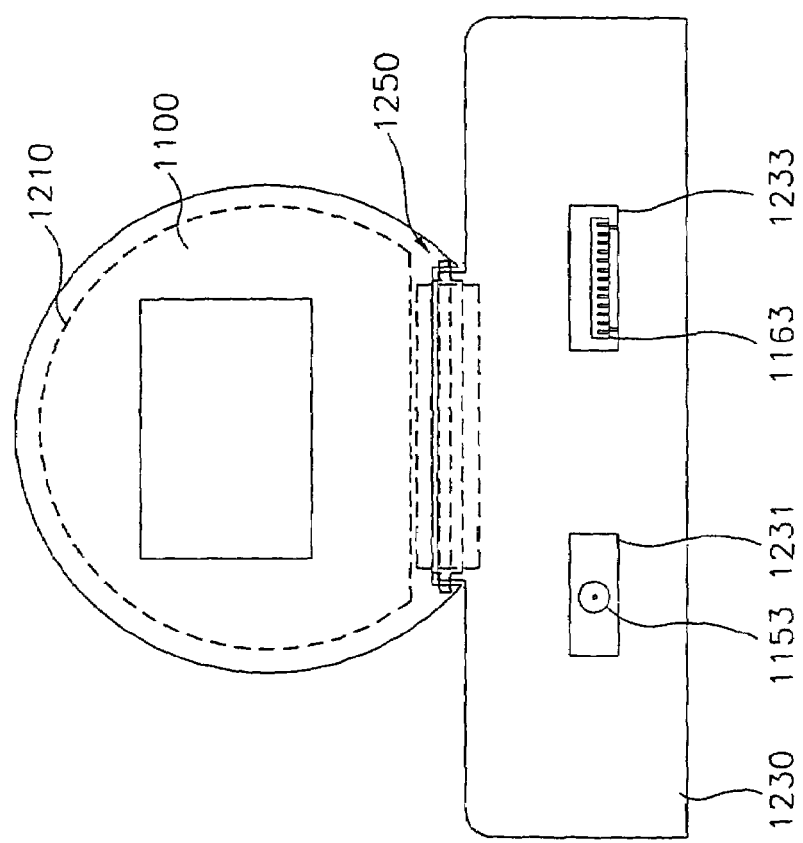

FIG. 26 is a perspective view for illustrating the case in which the liquid crystal display device is combined with the printed circuit board and FIG. 27 is a plan view for showing the case in which the liquid crystal display device is combined with the printed circuit board.

Referring to FIGS. 26 and 27, the case 1200 has a front case 1210 including a bottom where an opening having a predetermined size is formed to expose the effective display area of the display unit 200, and a rear case 1220 combined with the front case 1210.

Also, the case 1200 has a supporting portion 1242 including a front supporting portion 1230 for receiving the power and the data terminals 1150 and 1160, and a rear supporting portion 1240 that faces the front supporting portion 1230 and is combined with the front supporting portion 1230. The front and rear supporting portions 1230 and 1240 are respectively combined with the front and the rear cases 1210 and 1220 by using hinges 1250 to move the liquid crystal display device 1000 as shown in FIG. 26.

Openings having predetermined sizes are formed at the front supporting portion 1230 for receiving the first connector 1153 of the power terminal 1150 and the second connector 1163 of the data terminal 1160. Such openings are called as third and fourth receiving portions 1231 and 1233 for receiving the first and the second connectors 1153 and 1163, respectively.

As shown in FIG. 27, the third and fourth receiving portions 1231 and 1233 are respectively wider than the first and second connectors 1153 and 1163. Hence, the first and second connectors 1153 and 1163 received in the third and fourth receiving portions 1231 and 1233 can move in the left or the right direction, so that the liquid crystal display device 1000 may be easily connected with an external information processing device providing the driving power and the image data signal to the liquid crystal display device.

The assembled structure of the front supporting portion 1230, the power terminal 1150 and the data terminal 1160 will be described in detail with reference to FIGS. 28 and 29.

Figure 28:
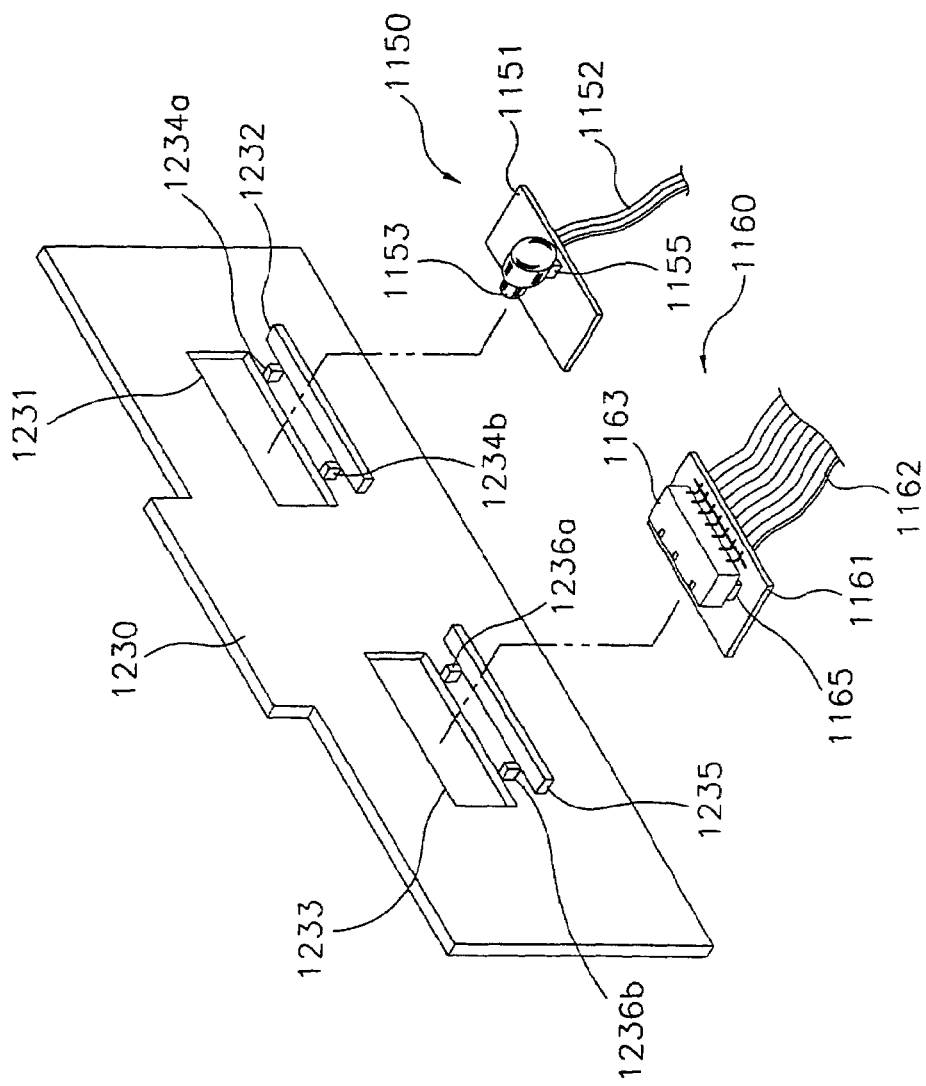
FIG. 28 is a perspective view for illustrating a front supporting portion shown in FIG. 27 and a power source and a data terminals assembled with the front supporting portion.
Figure 29:
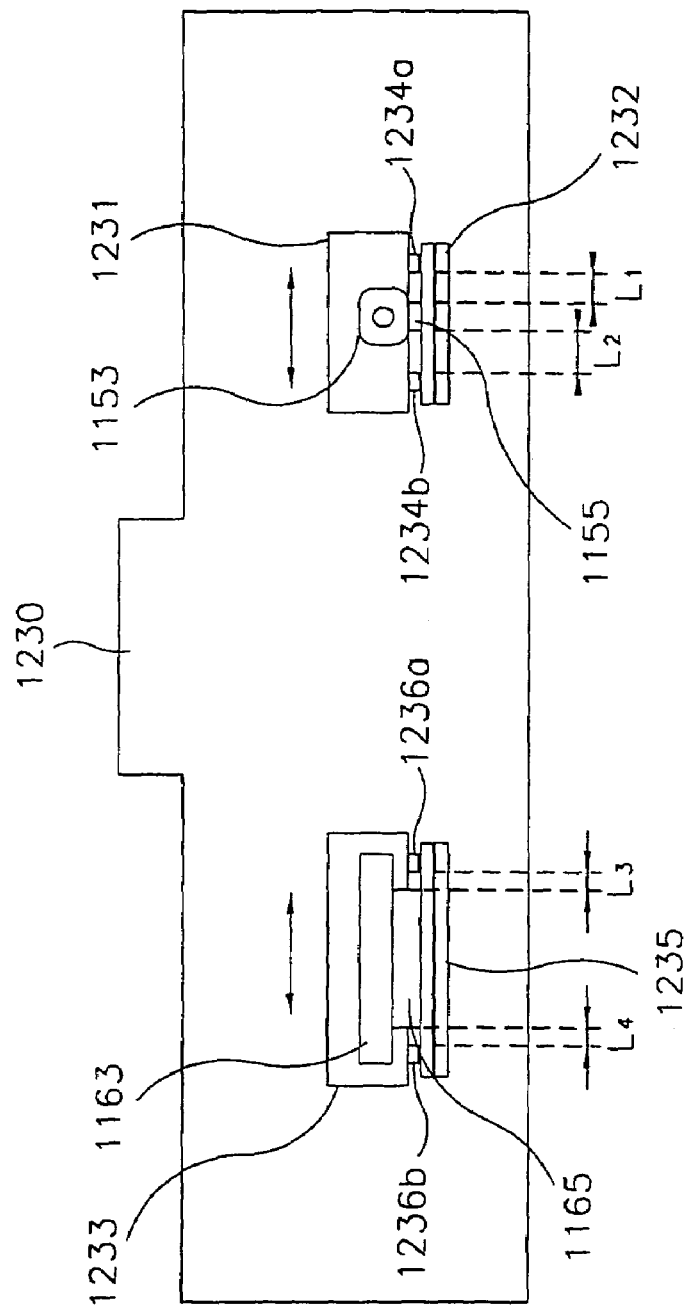
FIG. 29 is a plan view for showing operations of the power source and the data terminals assembled with the front supporting portion shown in FIG. 28.

FIG. 28 is a perspective view for showing the bottom structure of the front supporting portion shown in FIG. 27 and the structures of the power and the data terminals combined with the front supporting portion, and FIG. 29 is a plan view for illustrating the operation states of the power and the data terminals combined with the front supporting portion shown in FIG. 28.

Referring to FIG. 28, a first supporting stand 1232 for supporting the first printed circuit board 1151 having the first connector 1153 which is received in the third receiving portion 1231, is formed on the bottom of the front supporting portion 1230 under the third receiving portion 1231. A second supporting stand 1235 for supporting the second printed circuit board 1161 where the data terminal 1165 is installed, is formed on the front supporting portion 1230 under the fourth receiving portion 1233.

Also, first and second stopper 1234a and 1234b are formed between the third receiving portion 1231 and the first supporting stand 1232 to control the movement of the first connector 1153 received in the third receiving portion 1231 in the left or the right direction. In particular, the first stopper 1234a is positioned over one portion of the first supporting stand 1232 and is spaced apart from the upper face of the first supporting stand 1232. The second stopper 1234b is positioned over the other portion of the first supporting stand 1232 and is spaced apart from the upper face of the first supporting stand 1232. The first and second stoppers 1234a and 1234b are sufficiently spaced apart from the upper face of the first supporting stand 1232 to receive the first printed circuit board 1151. In addition, the interval between the first stopper 1234a and the second stopper 1234b is larger than the width of the first neck 1155 of the first connector 1153.

Therefore, when the first connector 1153 is received in the third receiving portion 1231 by supporting the first supporting stand 1232 as shown in FIG. 29, the interval of "L1" exists between the first neck 1155 of the first connector 1153 and the first stopper 1234a and the interval of "L2" exists between the first neck 1155 of the first connector 1153 and the second stopper 1234b. The rear supporting portion 1240 combined with the front supporting portion 1230 prevents the power terminal 1150 from separating from the front supporting portion 1230.

Also, third and fourth stoppers 1236a and 1236b are formed by a predetermined interval between the fourth receiving portion 1233 and the second supporting stand 1235 to control the movement of the second connector 1163 received in the fourth receiving portion 1233 in the left or the right direction. Particularly, the third stopper 1236a is positioned over one portion of the second supporting stand 1235 and is spaced apart from the upper face of the second supporting stand 1235. The fourth stopper 1236b is positioned over the other portion of the second supporting stand 1235 and is spaced apart from the upper face of the second supporting stand 1235. The third and fourth stoppers 1236a and 1236b are sufficiently spaced apart from the upper face of the second supporting stand 1235 to receive the second printed circuit board 1161. In addition, the interval between the third stopper 1236a and the fourth stopper 1236b is larger than the width of the second neck 1165 of the second connector 1163.

Therefore, when the second connector 1163 is received in the fourth receiving portion 1233 by supporting the second supporting stand 1235 as shown in FIG. 29, the interval of "L3" exists between the second neck 1165 of the second connector 1163 and the third stopper 1236a and the interval of "L4" exists between the second neck 1165 of the second connector 1163 and the fourth stopper 1236b. The rear supporting portion 1240 combined with the front supporting portion 1230 prevents the data terminal 1160 from being separated from the front supporting portion 1230.

The liquid crystal display device assembled with an external information processing device will be described with reference to FIGS. 30 and 31.

Figure 30:
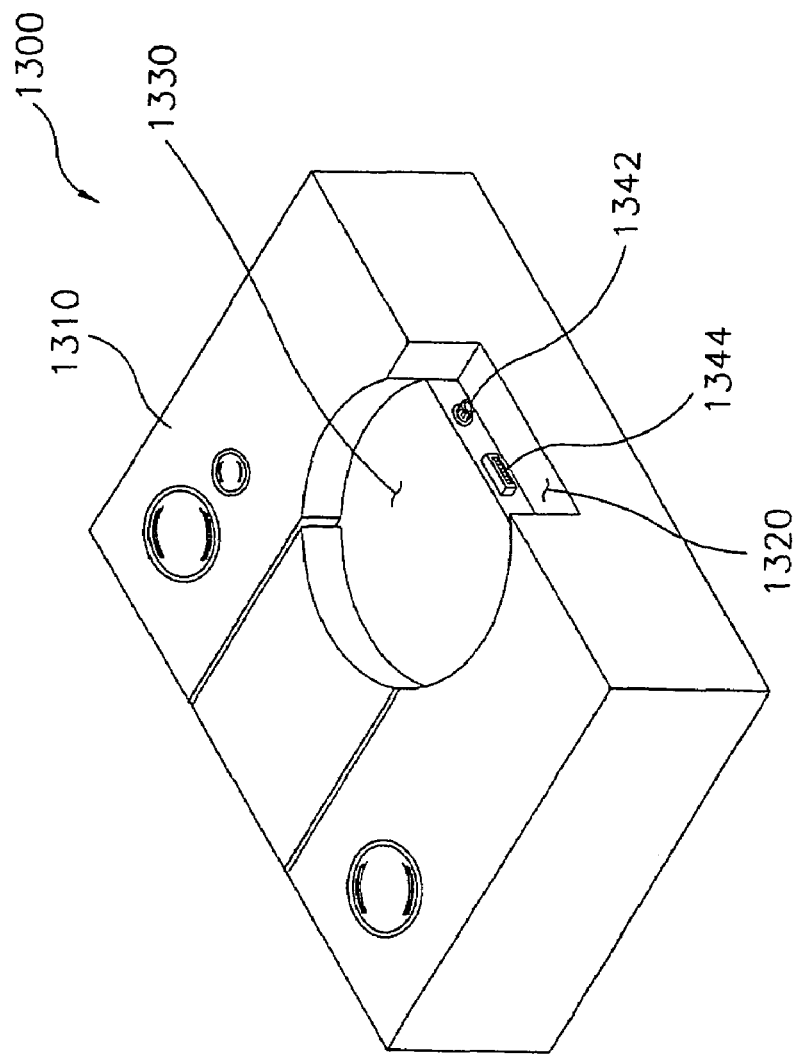
FIG. 30 is a perspective view for illustrating an outer information processing device assembled with the liquid crystal display device shown in FIG. 27.

FIG. 30 is a perspective view for illustrating the configuration of the external information processing device assembled with the liquid crystal display device shown in FIG. 27, and FIG. 31 is a schematic perspective view for showing the operation state of the liquid crystal display device assembled with the external information processing device shown in FIG. 31.

Referring to FIG. 30, a fifth receiving portion 1320 is formed on the rear surface of the external information processing device 1300 for receiving the front and rear supporting portions 1230 and 1240 of the case 1200. The rear face of the external information processing device 1300 is partially recessed to form the fifth receiving portion 1320. Also, a sixth receiving portion 1330 for receiving the front and rear cases 1210 and 1220 is extended from the fifth receiving portion 1320 to the upper face of the external information processing device 1300.

Third and fourth connectors 1342 and 1344 are formed on the bottom of the fifth receiving portion 1320. The third and fourth connectors 1342 and 1344 are connected to a power supplying and an information processing section installed in the external information processing device 1300 to provide the driving power and the image data signal to the first and second connectors 1153 and 1163.

In general, the third and fourth connectors 1342 and 1344 of the external information processing device 1300 are fixedly installed at specific positions. Namely, the interval between the third connector 1342 and the fourth connector 1344 is maintained at a predetermined distance determined during the manufacture process of the external information processing device 1300. Thus, when the first and second connectors 1153 and 1163 are fixedly installed at specific positions, the first and second connectors 1153 and 1163 may not be precisely connected to the third and fourth connectors 1342 and 1344 due to the minute processing errors which may occur during the manufacturing process of the external information processing device 1300 or the liquid crystal display device 1000.

To prevent such a problem, when the liquid crystal display device 1000 received in the case 1200 is combined with the external information processing device 1300, the first and second connectors 1153 and 1163 are movable in the left or the right direction so that the interval between the first connector 1153 and the second connector 1163 is maintained at a distance identical to the interval between the third connector 1342 and the fourth connector 1344 as shown in FIG. 31.

When the supporting portion 1242 is inserted in the fifth receiving portion 1320 so as to electrically connect the first and second connectors 1153 and 1163 with the third and fourth connectors 1342 and 1344, the liquid crystal display device 1000 is electrically coupled to the external information processing device 1300 as shown in FIG. 31.

The front and rear supporting portions 1230 and 1240 are combined with the front and rear cases 1210 and 1220 by the hinge 1250. Therefore, a user can utilize the liquid crystal display device 1000 in an upright position in a case where a certain information processing is performed by means of the external information processing device 1300 and the liquid crystal display device 1000. Also, the user can keep the liquid crystal display device 1000 received in the sixth receiving portion 1330 when the user does not use the liquid crystal display device 1000.

According to the liquid crystal display device of the present invention described above, at least one boss is formed on the bottom of a retainer for receiving the lamp generating the light and the light guide plate, and the boss guides the lamp and the light guiding plate to proper positions, thereby preventing the movement and the collision of the lamp and the light guide plate. Also, the end portion of the reflection plate for reflecting the light under the light guide plate is extended to the upper face of the lamp, thereby enclosing the outside of the lamp. Therefore, the number of the parts installed in the liquid crystal display device can be reduced, and the manufacturing cost can be decreased because the manufacturing process is simplified in comparison with the liquid crystal display device including a separate lamp cover.

Also, the transformer providing the driving power to the lamp and the liquid crystal display panel is received in the opening formed in the printed circuit board installed on the rear face of the retainer by a predetermined depth. Hence, the overall thickness of the liquid crystal display device can be reduced as much as the depth that the transformer is inserted into the opening.

Furthermore, the first and second connectors are respectively installed on the first and second printed circuit boards separated from the printed circuit board. The first and second connectors provide the image data signal and the driving power from outside to the power supply portion and signal converting portion formed on the printed circuit board. In addition, the first and second openings for receiving the first and second connectors have the sizes in which the first and second connectors can move toward each other or be spaced apart from each other. Thus, the interval between the first connector and the second connector can be adjusted according to the interval between the connectors installed on the external information processing device, thereby easily accomplishing the electrical connection between the liquid crystal display device and the external information processing device.

Although the exemplary embodiments of the present invention have been described, it is understood that the present invention should not be limited to these embodiments but various changes and modifications can be made by one skilled in the art within the spirit and scope of the present invention as hereinafter claimed.

What is claimed is:

1. A liquid crystal display device comprising:
   a light generating means for generating a light;
   a light guiding means for guiding the light to a display means for displaying an image;
   a reflecting means installed under said light guiding means, for reflecting the light toward said light guiding means; and
   a receiving means for receiving said reflecting means, said light guiding means and said light generating means,
   wherein said reflecting means comprises:
   a reflecting body portion and
   a reflection portion, said reflection portion being integrally formed with said reflection body portion and forming a continuous member, being extended from an end of said reflecting body portion with a predetermined length and being bent to enclose an outer perimeter of said light generating means,
   wherein said reflection portion is extended from at least two adjacent ends of said reflecting body portion, the adjacent reflection portions being overlapped with each other.

2. The liquid crystal display device of claim 1, wherein said reflecting means comprises a first reflecting member extended from an end of said reflecting body portion and a second reflecting member extended from an end of said first reflecting member, said second reflecting member covering an upper portion of said light generating means.

3. The liquid crystal display device of claim 1, wherein said receiving means comprises:
   a first receiving container having a side wall and a bottom, said bottom comprising an opening to expose a rear surface of said reflecting means; and
   a second receiving container, being combined with said first receiving container, for preventing said reflecting means, said light guiding means and said light generating means from being separated from said first receiving container.

4. The liquid crystal display device of claim 3, wherein said bottom of said first receiving container comprises bosses at corner portions of the bottom, the bosses being spaced from the side wall of said first receiving container.

5. The liquid crystal display device of claim 4, wherein said reflecting means comprises at least one hole corresponding to the bosses, said at least one hole being combined with said bosses, guiding said reflecting means to a receiving position.

6. The liquid crystal display device of claim 5, wherein said light generating means is an integral lamp having a bending portion and is received between the bosses and the side wall of said first receiving container.

7. The liquid crystal display device of claim 6, wherein an upper face of said bending portion of the lamp is covered with the overlapped adjacent reflection portions of said reflecting means.

8. The liquid crystal display device of claim 7, wherein said bending portion of said lamp comprises first and second bending portions and said reflection portion comprises first, second and third reflection portions extended from first, second and third ends of said reflecting body portion, each of upper surfaces of said first and second bending portions being covered with an overlapped portion of said first and second reflection portions and said second and third reflection portions, respectively.

9. The liquid crystal display device of claim 8, wherein a first end portion of the first reflection portion covering the first bending portion is extended longer than a first end portion of the second reflection portion.

10. The liquid crystal display device of claim 8, wherein a second end portion of the third reflection portion covering the second bending portion is extended longer than a second end portion of the second reflection portion.

11. The liquid crystal display device of claim 1,
    wherein said receiving means comprises:
    a first receiving container having a side wall; and
    a bottom, said bottom comprising an opening to expose a rear surface of said reflecting means and a boss at a corner portion of the bottom, the boss being spaced from the side wall of said first receiving container,
    wherein the overlapped adjacent reflection portions of said reflecting means covers the boss.

12. The liquid crystal display device of claim 11, wherein said bottom of said first receiving container comprises a plurality of bosses disposed at corner portions of the bottom, the bosses being spaced from the side wall of said first receiving container; and
    the reflecting means comprises a plurality of overlapped adjacent reflection portions, the overlapped adjacent reflection portions covering the bosses.

13. The liquid crystal display device of claim 12, wherein said reflecting means further comprises at least one hole corresponding to the bosses, said at least one hole being combined with said bosses, guiding said reflecting means to a receiving position.

* * * * *